(12) United States Patent
Murali et al.

(10) Patent No.: US 11,775,854 B2
(45) Date of Patent: Oct. 3, 2023

(54) CHARACTERIZING CROSSTALK OF A QUANTUM COMPUTING SYSTEM BASED ON SPARSE DATA COLLECTION

(71) Applicant: International Business Machines Corporation, Armonk, NY (US)

(72) Inventors: Prakash Murali, Princeton, NJ (US); Ali Javadiabhari, Sleepy Hollow, NY (US); David C. Mckay, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 667 days.

(21) Appl. No.: 16/677,772

(22) Filed: Nov. 8, 2019

(65) Prior Publication Data

US 2021/0142202 A1 May 13, 2021

(51) Int. Cl.
*G06N 10/00* (2022.01)
*G01R 31/28* (2006.01)

(52) U.S. Cl.
CPC ......... *G06N 10/00* (2019.01); *G01R 31/2837* (2013.01)

(58) Field of Classification Search
CPC ............................ G01R 31/2837; G06N 10/00
See application file for complete search history.

(56) References Cited

U.S. PATENT DOCUMENTS

| | | | |
|---|---|---|---|
| 8,089,286 B2 | 1/2012 | Silva et al. | |
| 9,870,277 B2 | 1/2018 | Berkley | |
| 10,031,791 B1 | 7/2018 | Wallman et al. | |
| 10,282,675 B2 | 5/2019 | Bloom et al. | |
| 2019/0044044 A1 | 2/2019 | Lampert et al. | |
| 2019/0147359 A1* | 5/2019 | Chen | H01P 3/003 257/31 |

FOREIGN PATENT DOCUMENTS

WO   2018026522 A1   2/2018

OTHER PUBLICATIONS

Sarovar et al. ("Detecting crosstalk errors in quantum information processors", https://arxiv.org/abs/1908.09855v1, arXiv: 1908.09855v1 [quant-ph], Aug. 26, 2019, pp. 1-23) (Year: 2019).*

(Continued)

*Primary Examiner* — Miranda M Huang
*Assistant Examiner* — Robert Lewis Kulp
(74) *Attorney, Agent, or Firm* — Amin, Turocy & Watson, LLP

(57) ABSTRACT

Systems, computer-implemented methods, and computer program products to facilitate characterizing crosstalk of a quantum computing system based on sparse data collection are provided. According to an embodiment, a system can comprise a memory that stores computer executable components and a processor that executes the computer executable components stored in the memory. The computer executable components can comprise a package component that packs subsets of quantum gates in a quantum device into one or more bins. The computer executable components can further comprise an assessment component that characterizes crosstalk of the quantum device based on a number of the one or more bins into which the subsets of quantum gates are packed.

25 Claims, 12 Drawing Sheets

(56) References Cited

OTHER PUBLICATIONS

Rudinger et al. ("Probing Context-Dependent Errors in Quantum Processors", Physical Review X 9, 021045, Jun. 3, 2019, pp. 1-12) (Year: 2019).*
Kenneth Rudinger ("Certifying Fault Tolerance with Gate Set Tomography", No. SAND2016-1901PE, Sandia National Lab (SNL-NM), 2016, pp. 1-61) (Year: 2016).*
Harper et al. ("Efficient learning of quantum noise", https://arxiv.org/pdf/1907.13022v1.pdf, arXiv:1907.13022v1 [quant-ph], Jul. 30, 2019, pp. 1-15) (Year: 2019).*
Helsen, et al., A new class of efficient randomized benchmarking protocols, Nature Partner Journals, Quantum Information, Aug. 21, 2019, 9 pages.
Matthew, et al., On the controlled-not complexity of controlled-not-phase circuits, Aug. 13, 2018, 21 pages.
Biamonte, et al., Quantum machine learning, Nature, Sep. 14, 2017, pp. 195-202.
Chamberland, et al., Topological and subsystem codes on low-degree graphs with flag qubits, Jul. 22, 2019, 20 pages.
Childs, et al., Quantum algorithm for a generalized hidden shift problem, Jul. 19, 2005, 16 pages.
Cirac, et al., Quantum computations with cold trapped ions. Physical Review Letters, May 1995, pp. 4091-4094, vol. 74, No. 20.
De Moura, et al., Z3: An Efficient SMT Solver, Tools and Algorithms for the Construction and Analysis of Systems, 2008, pp. 337-340.
Duncan, et al., Graph-theoretic simplification of quantum circuits with the zx-calculus, Sep. 16, 2019, 29 pages.
Duran, et al., Qiskit: An open-source framework for quantum computing, Last accessed Nov. 1, 2019, 3 pages.
Gambetta, et al., Characterization of addressability by simultaneous randomized benchmarking, Jan. 2, 2013, 10 pages.
Kelly, et al., A Preview of Bristlecone, Google's New Quantum Processor, Goolge AI Blog, Mar. 5, 2018, 3 pages.
Harper, et al., Efficient learning of quantum noise, Jul. 30, 2019, 15 pages.
Hill, et al., A surface code quantum computer in silicon, Oct. 30, 2015, 12 pages.
Anonymous, Qiskit Terra, https://github.com/Qiskit/qiskit-terra, Last accessed Nov. 5, 2019, 4 pages.
Anonymous, IBM Announces Advances to IBM Quantum Systems and Ecosystem, https://www-03.IBM.com/press/us/en/pressrelease/53374.wss, Last accessed Nov. 5, 2019, 3 pages.
Anonymous, IBM Quantum Devices, https://quantumexperience.ng.bluemix.net/qx/devices, Last accessed Nov. 5, 2019, 7 pages.
Anonymous, Qiskit Ignis, https://github.com/Qiskit/qiskit-ignis, Last accessed Nov. 5, 2019, 3 pages.
Anonymous, CES 2018: Intel's 49-Qubit Chip Shoots for Quantum Supremacy, https://spectrum.ieee.org/tech-talkcomputing/hardware/intels-49qubit-chip-aims-for-quantum-supremacy, Last accessed Nov. 5, 2019, 5 pages.
Kandala, et al., Hardwareefficient variational quantum eigensolver for small molecules and quantum magnets, Oct. 13, 2017, 24 pages.
Knill, et al., Randomized benchmarking of quantum gates, Jul. 6, 2007, 13 pages.
Krantz, et al., A quantum engineer's guide to superconducting qubits, Aug. 9, 2019, 66 pages.
Lloyd, et al., Quantum algorithms for supervised and unsupervised machine learning, Nov. 4, 2013, 11 pages.
Magesan, et al., Scalable and robust randomized benchmarking of quantum processes, Physical Review Letters, May 6, 2011, 4 pages.
Magesan, et al., Characterizing quantum gates via randomized benchmarking, Apr. 27, 2012, 19 pages.
Markov, et al., Quantum supremacy is both closer and farther than it appears, Aug. 17, 2018, 27 pages.
Maslov, et al., Basic circuit compilation techniques for an ion-trap quantum machine, Feb. 20, 2017, 16 pages.
Maslov, et al.,Quantum circuit simplification and level compaction, Feb. 27, 2008, 13 pages.
Maslov, et al., Quantum circuit placement, IEEE Transactions on Computer-Aided Design of Integrated Circuits and Systems, Mar. 27, 2008, 15 pages.
Mckay, et al., Efficient z gates for quantum computing, Jun. 29, 2017, 8 pages.
Mundada, et al., Suppression of qubit crosstalk in a tunable coupling superconducting circuit, Jun. 3, 2019, 11 pages.
Murali, et al., Noise-Adaptive Compiler Mappings for Noisy Intermediate-Scale Quantum Computers, Jan. 30, 2019, 14 pages.
Murali, et al., Full-stack, real-system quantum computer studies: Architectural comparisons and design insights, Jun. 11, 2019, 14 pages.
Nam, et al., Automated optimization of large quantum circuits with continuous parameters, May 10, 2018, 12 pages.
Neill, et al., A blueprint for demonstrating quantum supremacy with superconducting qubits, Sep. 19, 2017, 22 pages.
Peruzzo, et al., A variational eigenvalue solver on a photonic quantum processor, Nature Communications, Jul. 23, 2014, 7 pages.
Preskill, Quantum Computing in the NISQ era and beyond, Jul. 30, 2018, 20 pages.
Reagor, et al., Demonstration of universal parametric entangling gates on a multi-qubit lattice, Science Advances, Feb. 2, 2018, 9 pages.
Rigetti, PyQuil, https://github.com/rigetticomputing/pyquil, Last accessed Nov. 6, 2019, 4 pages.
Rigetti, et al., Superconducting qubit in a waveguide cavity with a coherence time approaching 0.1 ms, Feb. 24, 2012, 4 pages.
Rudinger, et al., Probing context-dependent errors in quantum processors, Physical Review, Jun. 3, 2019, pp. 021045-1-021045-12.
Sheldon, et al., Procedure for systematically tuning up cross-talk in the cross-resonance gate, Mar. 16, 2016, 6 pages.
Shor, et al., Polynomial-time algorithms for prime factorization and discrete logarithms on a quantum computer, Jan. 25, 1996, 28 pages.
Siraichi, et al.,Qubit allocation, International Symposium on Code Generation and Optimization, Feb. 28, 2018, 13 pages.
Smith, et al., A practical quantum instruction set architecture, Feb. 17, 2017, 15 pages.
Tannu, et al., Not all Qubits are Created Equal A Case for Variability-Aware Policies for NISQ-Era Quantum Computers, 2018, 12 pages.
Venturelli, et al., Compiling quantum circuits to realistic hardware architectures using temporal planners, Feb. 21, 2018, 17 pages.
Zulehner, et al., Compiling su (4) quantum circuits to ibm qx architectures, Jan. 24, 2019, 6 pages.
Mel, et al., The NIST Definition of Cloud Computing, National Institute of Standards and Technology Special Publication 800-145, Sep. 2011, 7 Pages.
International Search Report and Written Opinion for International Application No. PCT/EP2020/081282 dated Mar. 4, 2021, 16 pages.
Mohan Sarovar et al: "Detecting crosstalk errors in quantum information processors", arxiv.org, Cornell University Library, 201 Olin Library Cornell University Ithaca, NY 14853, Aug. 26, 2019 (Aug. 26, 2019), XP081470233, abstract; Sections I-V and Appendix C; figures 3, 4.

* cited by examiner

CHARACTERIZING CROSSTALK OF A QUANTUM COMPUTING SYSTEM BASED ON SPARSE DATA COLLECTION

BACKGROUND

The subject disclosure relates to characterizing crosstalk of a quantum computing system, and more specifically, to characterizing crosstalk of a quantum computing system based on sparse data collection.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, computer-implemented methods, and/or computer program products that facilitate characterizing crosstalk of a quantum computing system based on sparse data collection are described.

According to an embodiment, a system can comprise a memory that stores computer executable components and a processor that executes the computer executable components stored in the memory. The computer executable components can comprise a package component that packs subsets of quantum gates in a quantum device into one or more bins. The computer executable components can further comprise an assessment component that characterizes crosstalk of the quantum device based on a number of the one or more bins into which the subsets of quantum gates are packed. An advantage of such a system is that it can reduce crosstalk characterization time of a quantum device by reducing the number of experiments (e.g., crosstalk measurements) executed to measure conditional gate error rates.

In some embodiments, the assessment component performs crosstalk measurements of one or more of the subsets of quantum gates packed into the number of the one or more bins to characterize the crosstalk of the quantum device. An advantage of such a system is that it can reduce computational costs of a processor that executes the crosstalk measurements.

According to another embodiment, a computer-implemented method can comprise packing, by a system operatively coupled to a processor, subsets of quantum gates in a quantum device into one or more bins. The computer-implemented method can further comprise characterizing, by the system, crosstalk of the quantum device based on a number of the one or more bins into which the subsets of quantum gates are packed. An advantage of such a computer-implemented method is that it can be implemented to reduce crosstalk characterization time of a quantum device by reducing the number of experiments (e.g., crosstalk measurements) executed to measure conditional gate error rates.

In some embodiments, the computer-implemented method can further comprise performing, by the system, crosstalk measurements of one or more of the subsets of quantum gates packed into the number of the one or more bins to characterize the crosstalk of the quantum device. An advantage of such a computer-implemented method is that it can be implemented to reduce computational costs of a processor that executes the crosstalk measurements.

According to another embodiment, a computer program product facilitating a process to characterize crosstalk of a quantum computing system based on sparse data collection is provided. The computer program product comprising a computer readable storage medium having program instructions embodied therewith, the program instructions executable by a processor to cause the processor to pack, by the processor, subsets of quantum gates in a quantum device into one or more bins. The program instructions are further executable by the processor to cause the processor to characterize, by the processor, crosstalk of the quantum device based on a number of the one or more bins into which the subsets of quantum gates are packed. An advantage of such a computer program product is that it can reduce crosstalk characterization time of a quantum device by reducing the number of experiments (e.g., crosstalk measurements) executed to measure conditional gate error rates.

In some embodiments, the program instructions are further executable by the processor to cause the processor to perform, by the processor, crosstalk measurements of one or more of the subsets of quantum gates packed into the number of the one or more bins to characterize the crosstalk of the quantum device. An advantage of such a computer program product is that it can reduce computational costs of a processor that executes the crosstalk measurements.

According to an embodiment, a system can comprise a memory that stores computer executable components and a processor that executes the computer executable components stored in the memory. The computer executable components can comprise an identification component that identifies at least one subset of quantum gates in a quantum device that generate a defined level of crosstalk. The computer executable components can further comprise an assessment component that characterizes crosstalk of the quantum device based on the at least one subset of quantum gates. An advantage of such a system is that it can reduce crosstalk characterization time of a quantum device by reducing the number of experiments (e.g., crosstalk measurements) executed to measure conditional gate error rates.

In some embodiments, the assessment component simultaneously performs parallelized crosstalk measurements of quantum gate subsets of the quantum device at a first defined time to identify the at least one subset of quantum gates in the quantum device that generate the defined level of crosstalk; and characterizes the crosstalk of the quantum device at a second defined time based on the at least one subset of quantum gates in the quantum device that generate the defined level of crosstalk. An advantage of such a system is that it can reduce computational costs of a processor that executes the crosstalk measurements.

According to another embodiment, a computer-implemented method can comprise identifying, by a system operatively coupled to a processor, at least one subset of quantum gates in a quantum device that generate a defined level of crosstalk. The computer-implemented method can further comprise characterizing, by the system, crosstalk of the quantum device based on the at least one subset of quantum gates. An advantage of such a computer-implemented method is that it can be implemented to reduce crosstalk characterization time of a quantum device by reducing the number of experiments (e.g., crosstalk measurements) executed to measure conditional gate error rates.

In some embodiments, the computer-implemented method can further comprise performing, by the system, simultaneous parallelized crosstalk measurements of quantum gate subsets of the quantum device at a first defined time to identify the at least one subset of quantum gates in the quantum device that generate the defined level of crosstalk; and characterizing, by the system, the crosstalk of the quantum device at a second defined time based on the at least one subset of quantum gates in the quantum device that generate the defined level of crosstalk. An advantage of such a computer-implemented method is that it can be implemented to reduce computational costs of a processor that executes the crosstalk measurements.

DETAILED DESCRIPTION

Figure 1:
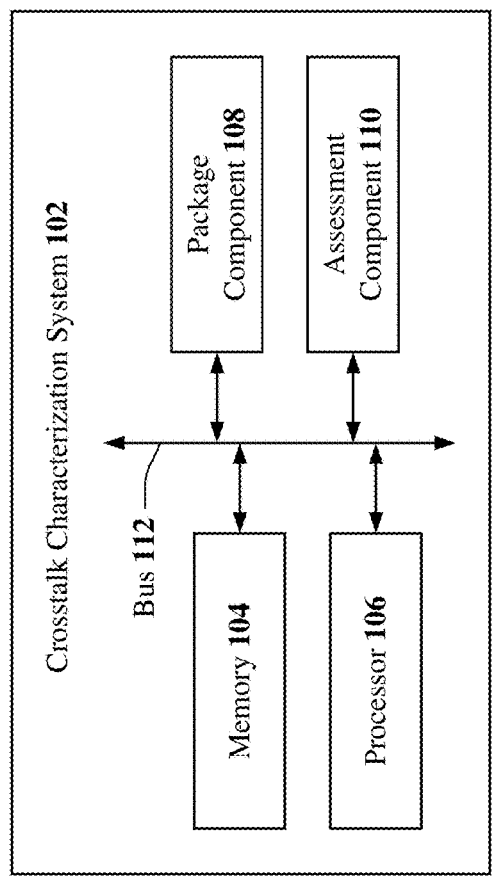
FIG. 1 illustrates a block diagram of an example, non-limiting system that can facilitate characterizing crosstalk of a quantum computing system based on sparse data collection in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum computing is generally the use of quantum-mechanical phenomena for the purpose of performing computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1, can entangle multiple quantum bits, and use interference.

Quantum computing has the potential to solve problems that, due to their computational complexity, cannot be solved, either at all or for all practical purposes, on a classical computer. However, quantum computing requires very specialized skills to, for example, characterize crosstalk between quantum gates (also referred to herein as gates) of a quantum device to enable mitigation of the crosstalk.

Crosstalk is an important source of noise when gates are driven simultaneously in a quantum machine. Crosstalk refers to the fact that the quality of a gate may degrade when another gate is driven simultaneously, in close proximity Fully characterizing crosstalk on a large-scale quantum system (e.g., a quantum device such as, for instance, a quantum computer, quantum processor, quantum circuit, etc.) can be challenging.

Existing quantum computing systems and/or administrators (e.g., vendors) operating such systems use a baseline method to characterize crosstalk on a quantum system (e.g., a quantum computer, quantum processor, quantum circuit, etc.). This baseline method involves executing a series of experiments (e.g., crosstalk measurements) using simultaneous randomized benchmarking (SRB).

A problem with such existing quantum computing systems is that they take a long time to characterize the crosstalk of a quantum system using the baseline method described above. Another problem with such existing quantum computing systems is that they have high computational costs resulting from executing the baseline method described above. For instance, with 100 random sequences per SRB, and 1024 trials per sequence, implementing this baseline method involves 22.6 million (M) executions and over 8 hours of computation at current execution rates on a 20-qubit machine. Another problem with such existing quantum computing systems is that they do not provide crosstalk rates in calibration data that is updated on a regular basis. For example, such existing quantum computing systems and/or administrators (e.g., vendors) operating such quantum computing systems do not currently report crosstalk rates in daily calibration data.

Given the above problem with existing technologies taking a long time to characterize the crosstalk of a quantum system using the baseline method described above, the present disclosure can be implemented to produce a solution to this problem in the form of systems, computer-implemented methods, and/or computer program products that can pack subsets of quantum gates in a quantum device into one or more bins and/or characterize crosstalk of the quantum device based on a number (e.g., a minimum number) of the one or more bins into which the subsets of quantum gates are packed. An advantage of such systems, computer-implemented methods, and/or computer program products is that they can reduce crosstalk characterization time of a quantum device by reducing the number of experiments (e.g., crosstalk measurements) executed to measure conditional gate error rates.

In some embodiments, the present disclosure can be implemented to produce a solution to the problem described above in the form of systems, computer-implemented methods, and/or computer program products that can perform crosstalk measurements of one or more of the subsets of quantum gates packed into the number of the one or more bins to characterize the crosstalk of the quantum device. An advantage of such systems, computer-implemented methods, and/or computer program products is that they can reduce computational costs of a processor that executes the crosstalk measurements.

Given the above problem with existing technologies taking a long time to characterize the crosstalk of a quantum system using the baseline method described above, the present disclosure can be implemented to produce a solution to this problem in the form of systems, computer-implemented methods, and/or computer program products that can identify at least one subset of quantum gates in a quantum device that generate a defined level of crosstalk and/or characterize crosstalk of the quantum device based on the at least one subset of quantum gates. An advantage of such systems, computer-implemented methods, and/or computer program products is that they can reduce crosstalk characterization time of a quantum device by reducing the number of experiments (e.g., crosstalk measurements) executed to measure conditional gate error rates.

In some embodiments, the present disclosure can be implemented to produce a solution to the problem described above in the form of systems, computer-implemented methods, and/or computer program products that can simultaneously perform parallelized crosstalk measurements of quantum gate subsets of the quantum device at a first defined time to identify the at least one subset of quantum gates in the quantum device that generate the defined level of crosstalk and characterize the crosstalk of the quantum device at a second defined time based on the at least one subset of quantum gates in the quantum device that generate the defined level of crosstalk. An advantage of such systems, computer-implemented methods, and/or computer program products is that they can reduce computational costs of a processor that executes the crosstalk measurements.

FIG. 1 illustrates a block diagram of an example, non-limiting system 100 that can facilitate characterizing crosstalk of a quantum computing system based on sparse data collection in accordance with one or more embodiments described herein. System 100 can comprise a crosstalk characterization system 102, which can be associated with a cloud computing environment. For example, crosstalk characterization system 102 can be associated with cloud computing environment 950 described below with reference to FIG. 9 and/or one or more functional abstraction layers described below with reference to FIG. 10 (e.g., hardware and software layer 1060, virtualization layer 1070, management layer 1080, and/or workloads layer 1090).

Crosstalk characterization system 102 and/or components thereof (e.g., package component 108, assessment component 110, identification component 202, etc.) can employ one or more computing resources of cloud computing environment 950 described below with reference to FIG. 9 and/or one or more functional abstraction layers (e.g., quantum software, etc.) described below with reference to FIG. 10 to execute one or more operations in accordance with one or more embodiments of the subject disclosure described herein. For example, cloud computing environment 950 and/or such one or more functional abstraction layers can comprise one or more classical computing devices (e.g., classical computer, classical processor, virtual machine, server, etc.), quantum hardware, and/or quantum software (e.g., quantum computing device, quantum computer, quantum processor, quantum circuit simulation software, superconducting circuit, etc.) that can be employed by crosstalk characterization system 102 and/or components thereof to execute one or more operations in accordance with one or more embodiments of the subject disclosure described herein. For instance, crosstalk characterization system 102 and/or components thereof can employ such one or more classical and/or quantum computing resources to execute one or more classical and/or quantum: mathematical function, calculation, and/or equation; computing and/or processing script; algorithm; model (e.g., artificial intelligence (AI) model, machine learning (ML) model, etc.); and/or another operation in accordance with one or more embodiments of the subject disclosure described herein.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Crosstalk characterization system 102 can comprise a memory 104, a processor 106, a package component 108, an assessment component 110, and/or a bus 112.

It should be appreciated that the embodiments of the subject disclosure depicted in various figures disclosed herein are for illustration only, and as such, the architecture of such embodiments are not limited to the systems, devices, and/or components depicted therein. For example, in some embodiments, system 100 and/or crosstalk characterization system 102 can further comprise various computer and/or computing-based elements described herein with reference to operating environment 800 and FIG. 8. In several embodiments, such computer and/or computing-based elements can be used in connection with implementing one or more of the systems, devices, components, and/or computer-implemented operations shown and described in connection with FIG. 1 or other figures disclosed herein.

Memory 104 can store one or more computer and/or machine readable, writable, and/or executable components and/or instructions that, when executed by processor 106 (e.g., a classical processor, a quantum processor, etc.), can facilitate performance of operations defined by the executable component(s) and/or instruction(s). For example, memory 104 can store computer and/or machine readable, writable, and/or executable components and/or instructions that, when executed by processor 106, can facilitate execution of the various functions described herein relating to crosstalk characterization system 102, package component 108, assessment component 110, and/or another component associated with crosstalk characterization system 102 (e.g., identification component 202, etc.), as described herein with or without reference to the various figures of the subject disclosure.

Memory 104 can comprise volatile memory (e.g., random access memory (RAM), static RAM (SRAM), dynamic RAM (DRAM), etc.) and/or non-volatile memory (e.g., read only memory (ROM), programmable ROM (PROM), electrically programmable ROM (EPROM), electrically erasable programmable ROM (EEPROM), etc.) that can employ one or more memory architectures. Further examples of memory 104 are described below with reference to system memory 816 and FIG. 8. Such examples of memory 104 can be employed to implement any embodiments of the subject disclosure.

Processor 106 can comprise one or more types of processors and/or electronic circuitry (e.g., a classical processor, a quantum processor, etc.) that can implement one or more computer and/or machine readable, writable, and/or executable components and/or instructions that can be stored on memory 104. For example, processor 106 can perform various operations that can be specified by such computer and/or machine readable, writable, and/or executable components and/or instructions including, but not limited to, logic, control, input/output (I/O), arithmetic, and/or the like. In some embodiments, processor 106 can comprise one or more central processing unit, multi-core processor, microprocessor, dual microprocessors, microcontroller, System on a Chip (SOC), array processor, vector processor, quantum processor, and/or another type of processor. Further examples of processor 106 are described below with reference to processing unit 814 and FIG. 8. Such examples of processor 106 can be employed to implement any embodiments of the subject disclosure.

Crosstalk characterization system 102, memory 104, processor 106, package component 108, assessment component 110, and/or another component of crosstalk characterization system 102 as described herein (e.g., identification component 202) can be communicatively, electrically, operatively, and/or optically coupled to one another via a bus 112 to perform functions of system 100, crosstalk characterization system 102, and/or any components coupled therewith. Bus 112 can comprise one or more memory bus, memory controller, peripheral bus, external bus, local bus, a quantum bus, and/or another type of bus that can employ various bus architectures. Further examples of bus 112 are described below with reference to system bus 818 and FIG. 8. Such examples of bus 112 can be employed to implement any embodiments of the subject disclosure.

Crosstalk characterization system 102 can comprise any type of component, machine, device, facility, apparatus, and/or instrument that comprises a processor and/or can be capable of effective and/or operative communication with a wired and/or wireless network. All such embodiments are envisioned. For example, crosstalk characterization system 102 can comprise a server device, a computing device, a general-purpose computer, a special-purpose computer, a quantum computing device (e.g., a quantum computer), a tablet computing device, a handheld device, a server class computing machine and/or database, a laptop computer, a notebook computer, a desktop computer, a cell phone, a smart phone, a consumer appliance and/or instrumentation, an industrial and/or commercial device, a digital assistant, a multimedia Internet enabled phone, a multimedia players, and/or another type of device.

Crosstalk characterization system 102 can be coupled (e.g., communicatively, electrically, operatively, optically, etc.) to one or more external systems, sources, and/or devices (e.g., classical and/or quantum computing devices, communication devices, etc.) via a data cable (e.g., High-Definition Multimedia Interface (HDMI), recommended standard (RS) 232, Ethernet cable, etc.). In some embodiments, crosstalk characterization system 102 can be coupled (e.g., communicatively, electrically, operatively, optically, etc.) to one or more external systems, sources, and/or devices (e.g., classical and/or quantum computing devices, communication devices, etc.) via a network.

In some embodiments, such a network can comprise wired and wireless networks, including, but not limited to, a cellular network, a wide area network (WAN) (e.g., the Internet) or a local area network (LAN). For example, crosstalk characterization system 102 can communicate with one or more external systems, sources, and/or devices, for instance, computing devices (and vice versa) using virtually any desired wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol, and/or other proprietary and non-proprietary communication protocols. In such an example, crosstalk characterization system 102 can thus include hardware (e.g., a central processing unit (CPU), a transceiver, a decoder, quantum hardware, a quantum processor, etc.), software (e.g., a set of threads, a set of processes, software in execution, quantum pulse schedule, quantum circuit, quantum gates, etc.) or a combination of hardware and software that facilitates communicating information between crosstalk characterization system 102 and external systems, sources, and/or devices (e.g., computing devices, communication devices, etc.).

Crosstalk characterization system 102 can comprise one or more computer and/or machine readable, writable, and/or executable components and/or instructions that, when executed by processor 106 (e.g., a classical processor, a quantum processor, etc.), can facilitate performance of operations defined by such component(s) and/or instruction(s). Further, in numerous embodiments, any component associated with crosstalk characterization system 102, as described herein with or without reference to the various figures of the subject disclosure, can comprise one or more computer and/or machine readable, writable, and/or executable components and/or instructions that, when executed by processor 106, can facilitate performance of operations defined by such component(s) and/or instruction(s). For example, package component 108, assessment component 110, and/or any other components associated with crosstalk characterization system 102 as disclosed herein (e.g., communicatively, electronically, operatively, and/or optically coupled with and/or employed by crosstalk characterization system 102), can comprise such computer and/or machine readable, writable, and/or executable component(s) and/or instruction(s). Consequently, according to numerous embodiments, crosstalk characterization system 102 and/or any components associated therewith as disclosed herein, can employ processor 106 to execute such computer and/or machine readable, writable, and/or executable component(s) and/or instruction(s) to facilitate performance of one or more operations described herein with reference to crosstalk characterization system 102 and/or any such components associated therewith.

Crosstalk characterization system 102 can facilitate performance of operations executed by and/or associated with package component 108, assessment component 110, and/or another component associated with crosstalk characterization system 102 as disclosed herein (e.g., identification component 202, etc.). For example, as described in detail below, crosstalk characterization system 102 can facilitate via processor 106 (e.g., a classical processor, a quantum processor, etc.): packing subsets of quantum gates in a quantum device into one or more bins; and/or characterizing crosstalk of the quantum device based on a number of the one or more bins into which the subsets of quantum gates are packed. In another example, crosstalk characterization system 102 can further facilitate via processor 106 (e.g., a classical processor, a quantum processor, etc.): performing crosstalk measurements of one or more of the subsets of quantum gates packed into the number of the one or more bins to characterize the crosstalk of the quantum device; performing the crosstalk measurements at a defined interval of time to capture crosstalk variations of at least one of the subsets of quantum gates packed into the number of the one or more bins; and/or performing simultaneous parallelized crosstalk measurements of at least two of the subsets of quantum gates packed into the number of the one or more bins to characterize the crosstalk of the quantum device, thereby facilitating at least one of reduced computational costs of the processor or reduced time to characterize the crosstalk of the quantum device. In some embodiments, the subsets of quantum gates can comprise at least two quantum gates separated by at least one quantum gate in the quantum device and/or the subsets of quantum gates can be separated by two or more quantum gates in the quantum device.

In another example, crosstalk characterization system 102 can facilitate via processor 106 (e.g., a classical processor, a quantum processor, etc.): identifying at least one subset of quantum gates in a quantum device that generate a defined level of crosstalk (e.g., a high level of crosstalk relative to other subsets of quantum gates in the quantum device); and/or characterizing crosstalk of the quantum device based on the at least one subset of quantum gates. In another example, crosstalk characterization system 102 can further facilitate via processor 106 (e.g., a classical processor, a quantum processor, etc.): packing quantum gate subsets of the quantum device into one or more bins and characterizing the crosstalk of the quantum device based on a number of the one or more bins into which the quantum gate subsets are packed; performing simultaneous parallelized crosstalk measurements of quantum gate subsets of the quantum device at a first defined time (e.g., at time=0 (t=0)) and/or on day 1) to identify the at least one subset of quantum gates in the quantum device that generate the defined level of crosstalk and characterizing (e.g., at a future time) the crosstalk of the quantum device at a second defined time (e.g., at t=1 and/or day 2, day 3, etc.) based on the at least one subset of quantum gates in the quantum device that generate the defined level of crosstalk; and/or identifying the at least one subset of quantum gates based on crosstalk measurements of one or more quantum gate subsets of the quantum device performed at a defined interval of time (e.g., once every 3 to 5 days). In some embodiments, the at least one subset of quantum gates can comprise a pair of quantum gates separated by a single quantum gate in the quantum device and/or the at least one subset of quantum gates can comprise quantum gate pairs separated by at least two quantum gates in the quantum device.

Reducing the Crosstalk Characterization of Overhead

Real-systems measurements (e.g., crosstalk measurements of different quantum devices) show that crosstalk can dramatically influence the gate error rates, which can in turn influence the reliability of applications. To mitigate these effects by compilation, crosstalk characterization system 102 (e.g., via package component 108, assessment component 110, and/or identification component 202) can make use of characterization data associated with the real-systems during instruction scheduling. Since crosstalk noise has spatio-temporal variations, it can be characterized daily to supply correct inputs to a compiler (e.g., gate errors and coherence times can be measured daily on quantum systems because of such spatio-temporal variations). Towards this end, and as described below, crosstalk characterization system 102 (e.g., via package component 108, assessment component 110, and/or identification component 202), can reduce the number of experiments executed to measure conditional gate error rates, where such experiments can comprise one or more crosstalk measurements of quantum gate subsets in a quantum device and such conditional gate error rates can be defined as follows.

Conditional Gate Error Rates: For a gate $g_i$, the independent error rate measured from two-qubit randomized benchmarking (RB) can be denoted as $E(g_i)$ and the error rate of $g_i$ measured simultaneously with $g_j$ can be denoted as conditional error rate $E(g_i|g_j)$. When a gate $g_i$ has crosstalk interference with $g_j$, the expectation is that $E(g_i|g_j)$ will be higher than $E(g_i)$.

Crosstalk characterization system 102 (e.g., via assessment component 110) can measure conditional error rates (CER) of every pair of controlled NOT gates (CNOT gates) that can be driven in parallel, where such CNOT gates comprise quantum logic gates used in gate-based quantum computing devices. For example, crosstalk characterization system 102 can measure conditional error rates of CNOT pairs in a quantum device comprising a first CNOT gate (CNOT 0,1) defined between qubits denoted as qubit 0 and qubit 1 and a second CNOT gate (CNOT 2,3) defined between qubits denoted as qubit 2 and qubit 3, where such pairs of quantum gates CNOT 0,1 and CNOT 2,3 do not share a qubit. For instance, with reference to qubit coupling map 402a illustrated in FIG. 4, crosstalk characterization system 102 can measure conditional error rates of CNOT pairs such as, for instance, gate pairs 404 comprising a CNOT gate defined between qubit 0 and qubit 1 (CNOT 0,1) and a CNOT gate defined between qubit 2 and qubit 3 (CNOT 2,3), where gate pairs 404 do not share a qubit.

The approach described above involves 221 pairs of simultaneous randomized benchmarking (SRB) experiments. Each such SRB experiment involves multiple runs with different random gate lengths to get the final curve fit to the theoretical model and each data point on the curve involves multiple trials because of noisy operations. With 100 random sequences per SRB, and 1024 trials per sequence, this baseline method requires 22.6M executions and over 8 hours of computation at current execution rates. Such runs described here can be performed (e.g., by crosstalk characterization system 102) to generate scatter plots 302a, 302b, 302c illustrated in FIG. 3. For instance, crosstalk characterization system 102 can perform all these experiments on quantum computing hardware (e.g., as opposed to in simulation) such as, for example, an integrated quantum circuit comprising multiple qubits fabricated on a semiconducting and/or superconducting device.

Without data related to the spatio-temporal behavior of crosstalk associated with a certain quantum computing device, crosstalk characterization system 102 can run such SRB experiments described above on a regular basis to enable compiler-level mitigation of the crosstalk. For example, crosstalk characterization system 102 can run these SRB experiments on a daily basis to enable compiler-level mitigation of the crosstalk. However, running these SRB experiments on such a regular basis takes a long time and is computationally expensive.

To reduce such crosstalk characterization overhead (e.g., computational costs and/or time to characterize crosstalk), crosstalk characterization system 102 can employ package component 108, assessment component 110, and/or identification component 202 to characterize crosstalk of a quantum computing system (e.g., a quantum computing device) based on a series of observations that support the use of sparse data collection to facilitate such characterization. For example, crosstalk characterization system 102 can employ such components to characterize crosstalk of a quantum computing system based on a series of observations associated with data obtained from implementing one or more physical (e.g., not simulated) quantum computing devices (e.g., quantum computer, quantum processor, quantum hardware, etc.), where such data can comprise the information depicted in scatter plots 302a, 302b, 302c of FIG. 3, graph 502 of FIG. 5, and/or bar chart 602 of FIG. 6.

Figure 3:
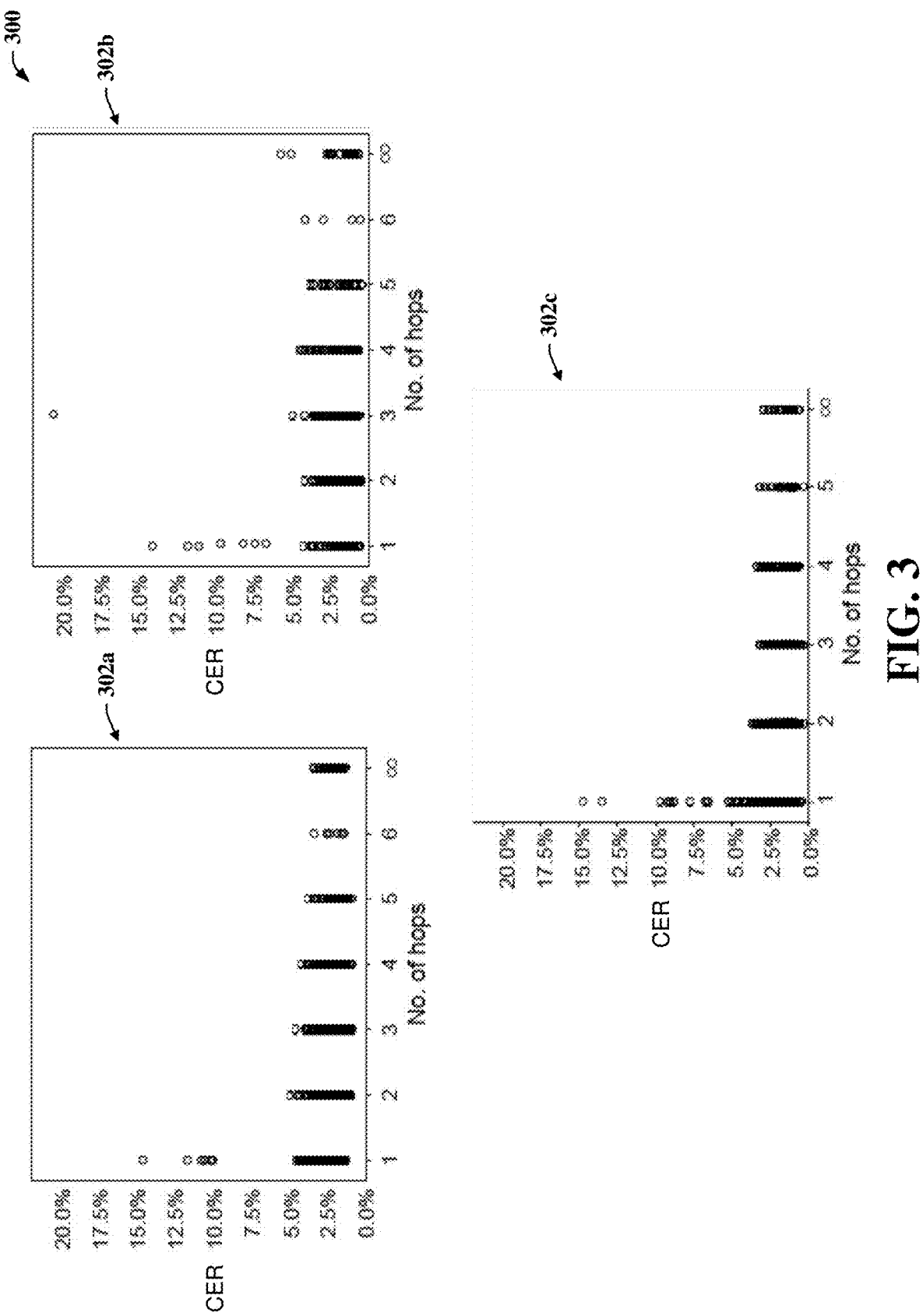
FIG. 3 illustrates example, non-limiting information that can facilitate characterizing crosstalk of a quantum computing system based on sparse data collection in accordance with one or more embodiments described herein.

In an example, with reference to scatter plots 302a, 302b, 302c illustrated in FIG. 3, crosstalk characterization system 102 can reduce crosstalk characterization overhead based on a first observation that crosstalk noise from a gate is significant only at 1 hop distance and thus, it is sufficient to perform SRB experiments on gate pairs which are separated by 1 hop (e.g., separated by a single gate, where the gates of the gate pairs do not share a qubit). For instance, the Hamiltonian of superconducting systems is governed by nearest-neighbor couplings and thus, it is sufficient to characterize crosstalk between quantum hardware gates separated by 1 hop only. As referenced herein, hop can describe a distance between quantum gates.

FIG. 3 illustrates example, non-limiting information 300 that can facilitate characterizing crosstalk of a quantum computing system based on sparse data collection in accordance with one or more embodiments described herein. Repetitive description of like elements and/or processes employed in respective embodiments is omitted for sake of brevity.

Information 300 can comprise scatter plots 302a, 302b, 302c. Scatter plots 302a, 302b, 302c can comprise data obtained from implementing one or more physical (e.g., not simulated) quantum computing devices (e.g., quantum computer, quantum processor, quantum hardware, etc.). For example, scatter plots 302a, 302b, 302c can comprise data obtained from implementing a first quantum computing device, a second quantum computing device, and a third quantum computing device, respectively. For instance, scatter plots 302a, 302b, 302c can comprise data obtained from performing simultaneous RB (SRB) experiments on all pairs of CNOT operations in three different physical (e.g., not simulated) quantum computing devices (e.g., quantum computing hardware), one pair at a time.

Scatter plots 302a, 302b, 302c can comprise data obtained from performing an SRB experiment on a pair $g_i$ and $g_j$ that yields conditional error rates (CER) $E(g_i|g_j)$ and $E(g_j|g_i)$. At hop count k (denoted as number (no.) of hops in FIG. 3), scatter plots 302a, 302b, 302c show these conditional error rates (CER) for gate pairs separated by k hops. For easy comparison, at distance ∞ scatter plots 302a, 302b, 302c depict the independent, crosstalk-free error rates for each gate. In scatter plot 302a, at hop count 1 there are several gate pairs which have conditional error rates higher than 7.5%, which is much higher than the maximum Y-axis value of the scatter plot at distance ∞, indicating crosstalk effects at 1 hop distance. On these 3 devices, crosstalk noise from a gate primarily influences only gates which are at 1 hop distance.

Based on this first observation that crosstalk noise from a gate is significant only at 1 hop distance and thus, it is sufficient to perform SRB experiments on gate pairs which are separated by 1 hop, crosstalk characterization system 102 can reduce crosstalk characterization overhead based on a second observation illustrating that when two gate pairs are separated by two or more hops, their SRB measurements can be performed in parallel. For example, with reference to qubit coupling maps 402a, 402b illustrated in FIG. 4, based on the first observation described above, crosstalk characterization system 102 can reduce crosstalk characterization overhead by employing package component 108 and/or assessment component 110 to efficiently parallelize crosstalk measurements across several gate pairs, where each of such gate pairs are separated by two or more hops.

Figure 4:
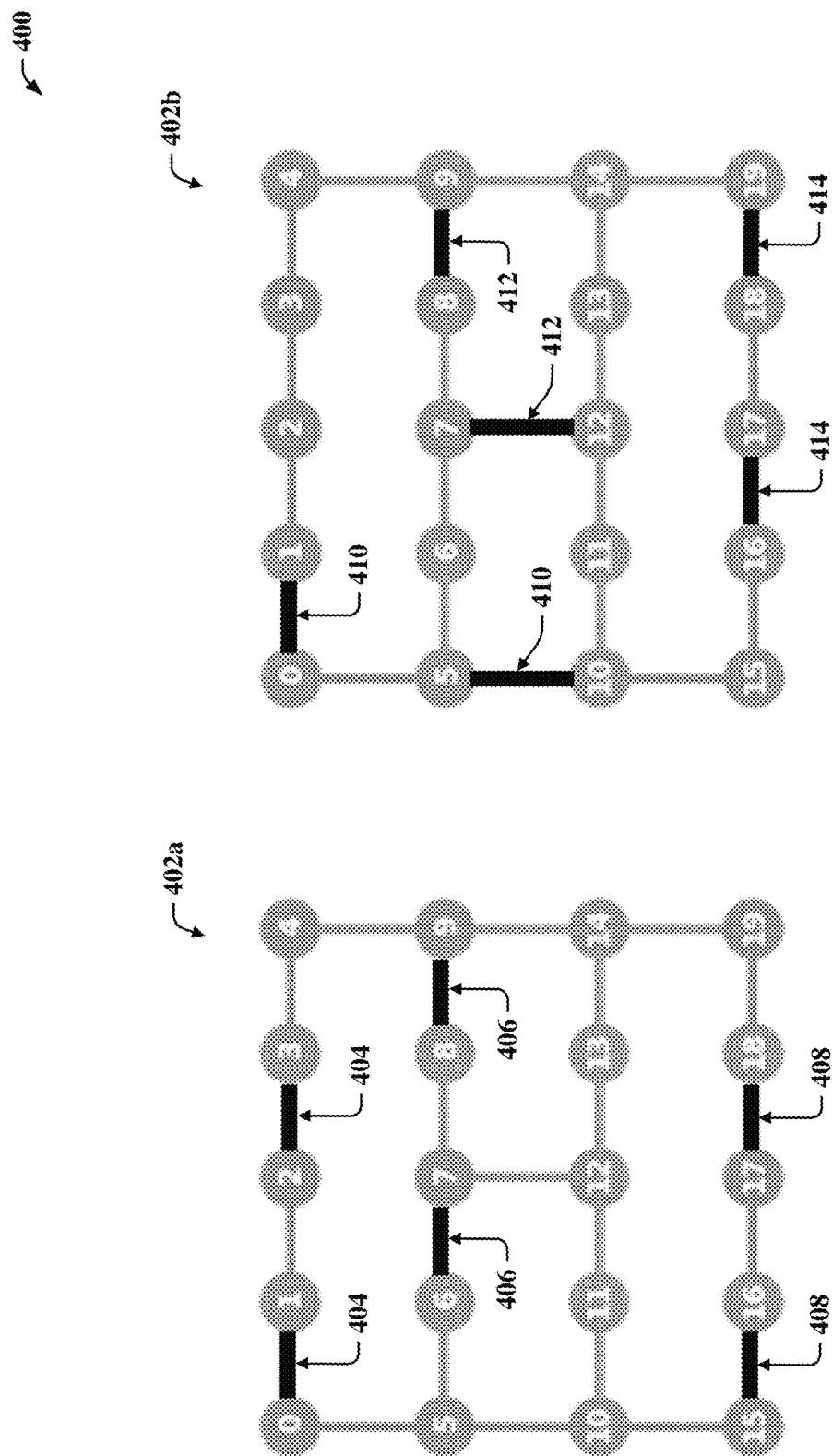
FIG. 4 illustrates an example, non-limiting diagram that can facilitate characterizing crosstalk of a quantum computing system based on sparse data collection in accordance with one or more embodiments described herein.

FIG. 4 illustrates an example, non-limiting diagram 400 that can facilitate characterizing crosstalk of a quantum computing system based on sparse data collection in accordance with one or more embodiments described herein. Repetitive description of like elements and/or processes employed in respective embodiments is omitted for sake of brevity.

Diagram 400 can comprise one or more qubit coupling maps 402a, 402b. Qubit coupling maps 402a, 402b can comprise topographic illustrations of qubits (represented by nodes denoted as 0 to 19 in FIG. 4) in a quantum computing device, where two or more of such qubits are coupled to each other by quantum gates (represented by lines that connect certain nodes representing qubits in FIG. 4). Qubit coupling map 402a can comprise one or more gate pairs 404, 406, 408. Qubit coupling maps 402b can comprise one or more gate pairs 410, 412, 414. Gate pairs 404, 406, 408 and/or gate pairs 410, 412, 414 can comprise CNOT gate pairs. For example, gate pair 404 can comprise a CNOT gate defined between qubit 0 and qubit 1 (CNOT 0,1) and a CNOT gate defined between qubit 2 and qubit 3 (CNOT 2,3), where CNOT 0,1 and CNOT 2,3 do not share a qubit.

When two gate pairs are separated by two or more hops, their SRB measurements can be performed in parallel by assessment component 110. For example, assessment component 110 can perform crosstalk measurement for gate pair 404 (CNOT 0,1|CNOT 2,3), gate pair 406 (CNOT 6,7|CNOT 8,9), and gate pair 408 (CNOT 15,16|CNOT 17,18) in the same experiment (e.g., simultaneously) since each pair is at least 2 hops away from any other pair.

To efficiently parallelize SRB experiments, crosstalk characterization system 102 can employ package component 108 to model the problem as an instance of bin packing. Package component 108 can pack subsets of quantum gates in a quantum device into one or more bins. For example, package component 108 can pack subsets of quantum gates in a quantum device (e.g., a quantum computer, quantum processor, quantum circuit, etc.) into one or more bins where the subsets of quantum gates comprise at least two quantum gates separated by at least one quantum gate in the quantum device. For instance, package component 108 can pack subsets of quantum gates comprising pairs of quantum gates in a quantum device into one or more bins. In another example, package component 108 can pack subsets of quantum gates in a quantum device into one or more bins where the subsets of quantum gates are separated by two or more quantum gates in the quantum device. To facilitate such packing of the subsets (e.g., pairs) of quantum gates into one or more bins, package component 108 can employ a heuristic approach (e.g., a heuristic algorithm) as described below.

Given a set of n gate pairs on which SRB measurements are to be performed, package component 108 can use a heuristic technique (e.g., a heuristic algorithm), for instance, a randomized first fit heuristic (e.g., a bin packing algorithm) to pack the gate pairs into a small number of experiments. For instance, package component 108 can employ such a heuristic to iteratively build a set of bins, where each bin corresponds to an experiment and initially, there is only one empty bin. Package component 108 can employ such a heuristic to iterate through the gate pairs of a quantum computing device (e.g., gate pairs 404, 406, 408 and/or gate pairs 410, 412, 414) and place each gate pair in the first compatible bin. For example, a gate pair $(g_i, g_j)$ is compatible with a bin if all gate pairs $(g_k, g_l)$ in the bin are at least k hops away. For instance, with reference to FIG. 4, in a certain quantum computing device, with k=2, gate pair 408 (CNOT 15,16|CNOT 17,18) is compatible with a bin which contains gate pair 406 (CNOT 6,7|CNOT 8,9); it is not compatible with a bin which contains a gate pair defined as CNOT 10,11|CNOT 12,13).

When no existing bin is compatible, package component 108 can employ such a heuristic described above to create a new bin. Based on application of such a heuristic by package component 108, all gate pairs can be partitioned into one or more sets of bins in this manner. Package component 108 can execute the heuristic algorithm multiple times by shuffling the list of gate pairs randomly and can further select the partitioning (e.g., the set of bins) with the minimum number of bins (e.g., the lowest number of bins). Based on such partitioning of all gate pairs in a quantum device and selection of the partitioning with the minimum number of bins, assessment component 110 can perform SRB experiments in parallel for all gate pairs from a single bin.

Assessment component 110 can characterize crosstalk of the quantum device described above based on the number of the one or more bins into which the subsets of quantum gates are packed. To characterize crosstalk of the quantum device, assessment component 110 can perform crosstalk measurements of one or more of the subsets of quantum gates packed into the number (e.g., the minimum number) of the one or more bins. Assessment component 110 can simultaneously perform parallelized crosstalk measurements of at least two of the subsets of quantum gates packed into the number of the one or more bins to characterize the crosstalk of the quantum device. For instance, assessment component 110 can perform SRB experiments to measure the independent error rates and/or conditional gate error rates of at least two of the subsets of quantum gates packed into the number (e.g., the minimum number) of the one or more bins to characterize the crosstalk of the quantum device.

Assessment component 110 can perform the crosstalk measurements at a defined interval of time (e.g., every 3 to 5 days) to capture crosstalk variations of at least one of the subsets of quantum gates packed into the number of the one or more bins. In another example, as described below, assessment component 110 can perform the crosstalk measurements at a defined interval of time (e.g., every 3 to 5 days) to identify one or more of the subsets of quantum gates packed into the number of the one or more bins that generate a defined level of crosstalk (e.g., a high level of crosstalk relative to other subsets of quantum gates in the quantum device).

Crosstalk characterization system 102 can further reduce crosstalk characterization overhead based on a third observation illustrating that high-crosstalk pairs remain relatively stable across several days. This is due to the structural nature of crosstalk pairs, and compared to gate errors, they are less prone to drift or regular changes. Hence, crosstalk characterization system 102 can employ assessment component 110 to perform regular (e.g., daily) crosstalk measurements on high-crosstalk pairs only as described below, and periodically, for instance, once every 3 to 5 days, characterize the remaining 1 hop gate pairs (e.g., by performing SRB experiments on the gate pairs remaining in each bin of the number of one or more bins described above that do not generate a high level of crosstalk).

Assessment component 110 can simultaneously perform parallelized crosstalk measurements (e.g., SRB experiments) of quantum gate subsets of the quantum device at a first defined time to identify at least one subset of quantum gates in the quantum device that generate a defined level of crosstalk and/or can further characterize the crosstalk of the quantum device at a second defined time based on the at least one subset of quantum gates in the quantum device that generate the defined level of crosstalk. For instance, assessment component 110 can simultaneously perform parallelized crosstalk measurements of quantum gate subsets packed into the number of the one or more bins at time=0 (t=0) and/or on day 1 of operation to identify one or more quantum gate pairs in the quantum device that generate a high level of crosstalk (e.g., a high level of crosstalk relative to other quantum gate pairs in the quantum device). In this example, at a later time such as, for instance, at t=1 and/or on day 2 of operation, assessment component 110 can perform crosstalk measurements on only the quantum gate pair(s) that have been identified (e.g., by identification component 202 as described with reference to FIG. 2) as generating such a high level of crosstalk and characterize the crosstalk of the quantum device based on such measurements.

Figure 2:
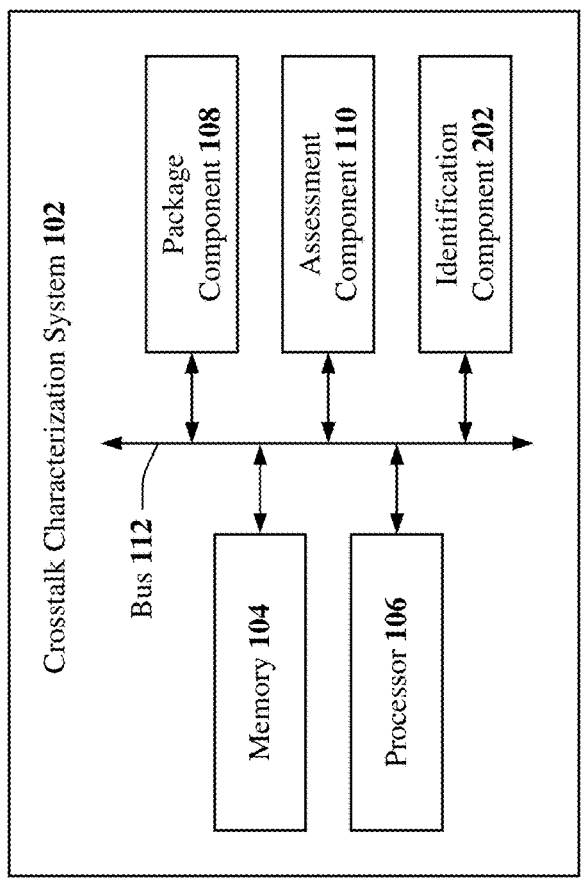
FIG. 2 illustrates a block diagram of an example, non-limiting system that can facilitate characterizing crosstalk of a quantum computing system based on sparse data collection in accordance with one or more embodiments described herein.

FIG. 2 illustrates a block diagram of an example, non-limiting system 200 that can facilitate characterizing crosstalk of a quantum computing system based on sparse data collection in accordance with one or more embodiments described herein. System 200 can comprise crosstalk characterization system 102, which can comprise an identification component 202. Repetitive description of like elements and/or processes employed in respective embodiments is omitted for sake of brevity.

Identification component 202 can identify at least one subset of quantum gates in a quantum device that generate a defined level of crosstalk. For example, based on crosstalk measurements performed by assessment component 110 on the subsets of quantum gates packed into the number of the one or more bins described above, identification component 202 can identify one or more of such subsets of quantum gates that generate a defined level of crosstalk. For instance, based on such crosstalk measurements that can be performed by assessment component 110 at a defined interval of time (e.g., every 3 to 5 days), identification component 202 can identify one or more subsets of quantum gates packed into the number of the one or more bins that generate a high level of crosstalk (e.g., high level of crosstalk relative to other subsets of quantum gates in the quantum device).

In an example, based on such crosstalk measurements performed by assessment component 110 on the subsets of quantum gates packed into the number of the one or more bins described above, assessment component 110 can provide the results of such experiments to identification component 202, where such experiment results can comprise error rates (e.g., independent error rates and/or conditional error rates) corresponding to the one or more subsets of quantum gates packed into the number of the one or more bins. In this example, identification component 202 can compile the experiment results and/or plot such data to identify one or more subsets of quantum gates packed into the number of the one or more bins that generate a high level of crosstalk (e.g., high level of crosstalk relative to other subsets of quantum gates in the quantum device). For instance, identification component 202 can utilize such experiment results to generate plots 504a, 504b, 504c, 504d of graph 502 depicted in FIG. 5 and/or analyze such plots to identify subset(s) of quantum gates (e.g., gate pairs 506a, 506b, 506c, 506d described with reference to FIG. 5) that generate a defined level of crosstalk (e.g., a high level of crosstalk relative to other subsets of quantum gates in the quantum device).

Figure 5:
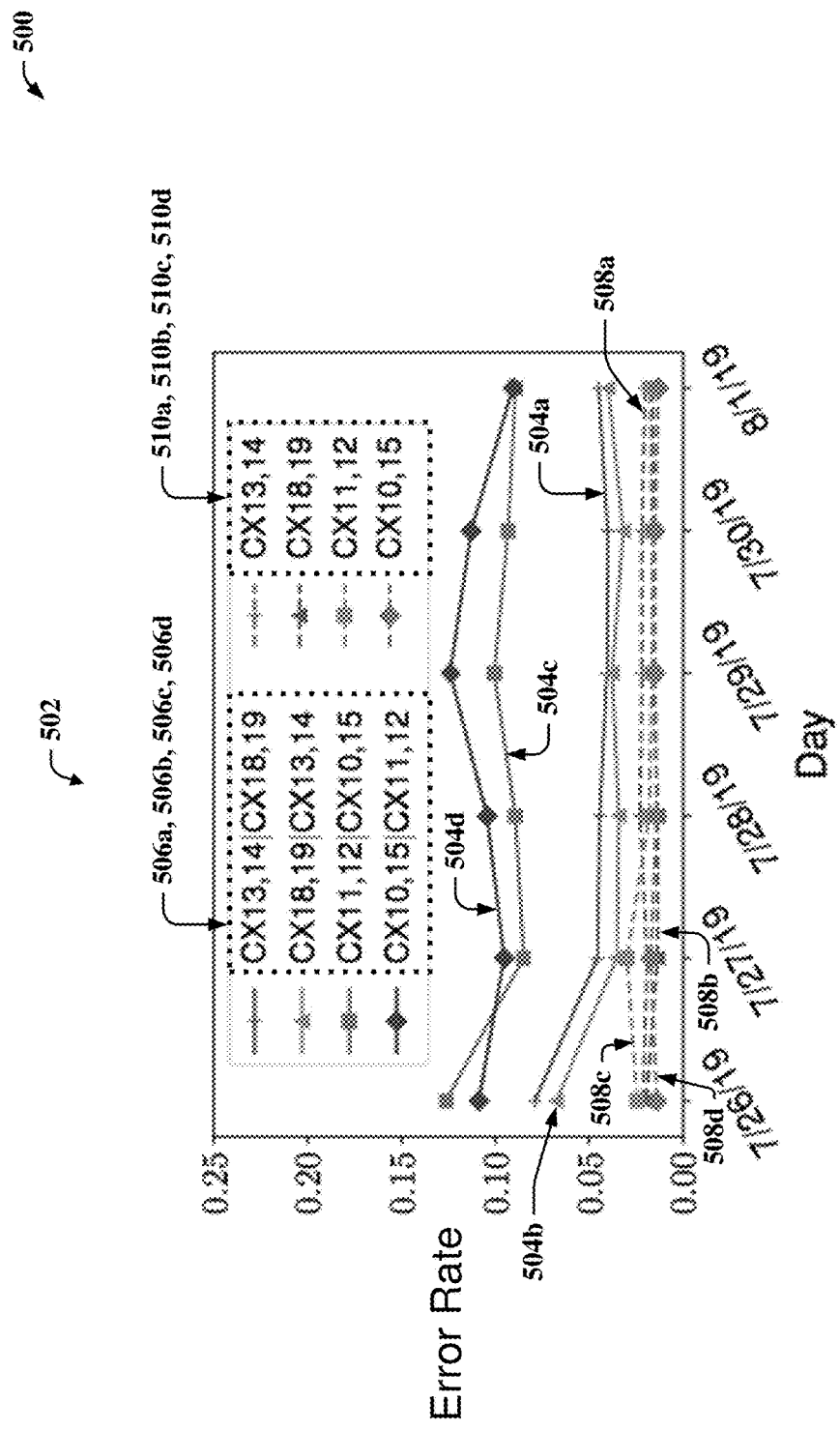
FIG. 5 illustrates example, non-limiting information that can facilitate characterizing crosstalk of a quantum computing system based on sparse data collection in accordance with one or more embodiments described herein.

In an example, identification component 202 can utilize such experiment results to generate plots 504a, 504b, 504c, 504d of graph 502 depicted in FIG. 5 and/or analyze such plots to identify, for instance, one or more of gate pairs 506a, 506b, 506c, 506d (e.g., gate pair 506c and/or gate pair 506d) that generate a high level of crosstalk relative to the other subsets of quantum gates in the quantum device (e.g., gate pairs 506a, 506b). Based on such identification of gate pairs that generate a high level of crosstalk, assessment component 110 can perform regular (e.g., daily) crosstalk measurements on such gate pairs, and periodically, for instance, once every 3 to 5 days, perform SRB experiments on the remaining 1 hop gate pairs to characterize crosstalk of such 1 hop gate pairs.

FIG. 5 illustrates example, non-limiting information 500 that can facilitate characterizing crosstalk of a quantum computing system based on sparse data collection in accordance with one or more embodiments described herein. Repetitive description of like elements and/or processes employed in respective embodiments is omitted for sake of brevity.

Information 500 can comprise a graph 502. Graph 502 can comprise one or more plots of error rates (e.g., independent error rates and conditional error rates (CER)) of quantum gates in a certain physical (e.g., not simulated) quantum computing device measured on a daily basis over several days (e.g., 6 days). Graph 502 can depict daily variations of crosstalk noise in such a quantum computing device, where plots 504a, 504b, 504c, 504d can illustrate daily variations of conditional error rates (CER) of gate pairs 506a, 506b, 506c, 506d, respectively and plots 508a, 508b, 508c, 508d can illustrate daily variations of independent error rates of gates 510a, 510b, 510c, 510d, respectively.

As illustrated by plots 504*a*, 504*b*, 504*c*, 504*d* and plots 508*a*, 508*b*, 508*c*, 508*d*, conditional error rates (CER) of gate pairs 506*a*, 506*b*, 506*c*, 506*d* are higher, for instance, approximately 2 times (2×) higher than independent error rates of gates 510*a*, 510*b*, 510*c*, 510*d* over the experiment period of 6 days on such a certain quantum computing device. In an example embodiment (not illustrated in the figures) where two additional physical (e.g., not simulated) quantum computing devices are also tested over the same 6 day experiment period, plots 504*a*, 504*b*, 504*c*, 504*d* and plots 508*a*, 508*b*, 508*c*, 508*d* illustrate that conditional error rates (CER) of gate pairs 506*a*, 506*b*, 506*c*, 506*d* are approximately 3× higher than independent error rates of gates 510*a*, 510*b*, 510*c*, 510*d*.

In some embodiments, plots 504*a*, 504*b*, 504*c*, 504*d* corresponding to gate pairs 506*a*, 506*b*, 506*c*, 506*d* can be used to identify one or more subsets of quantum gates in a quantum device that generate a defined level of crosstalk. For example, plots 504*a*, 504*b*, 504*c*, 504*d* corresponding to gate pairs 506*a*, 506*b*, 506*c*, 506*d* can be used by identification component 202 to identify one or more of gate pairs 506*a*, 506*b*, 506*c*, 506*d* (e.g., gate pairs 506*c*, 506*d*) that generate a high level of crosstalk (e.g., a high level of crosstalk relative to other gate pairs such as, gate pairs 506*a*, 506*b*).

Figure 6:
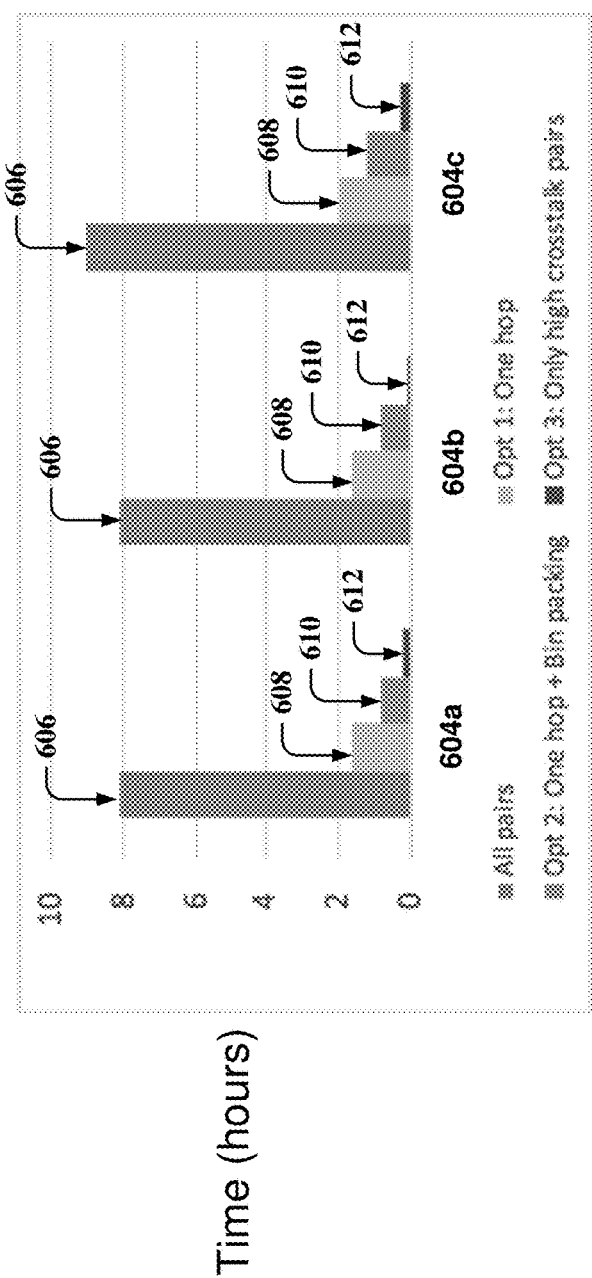
FIG. 6 illustrates example, non-limiting information that can facilitate characterizing crosstalk of a quantum computing system based on sparse data collection in accordance with one or more embodiments described herein.

FIG. 6 illustrates example, non-limiting information 600 that can facilitate characterizing crosstalk of a quantum computing system based on sparse data collection in accordance with one or more embodiments described herein. Repetitive description of like elements and/or processes employed in respective embodiments is omitted for sake of brevity.

Information 600 can comprise a bar chart 602 that illustrates crosstalk characterization times corresponding to three physical (e.g., not simulated) quantum computing devices 604*a*, 604*b*, 604*c* (e.g., quantum computer, quantum processor, quantum hardware, etc.) that have been implemented using one or more of the crosstalk characterization processes described herein in accordance with one or more embodiments of the subject disclosure.

Bar 606 depicts the amount of time it takes to characterize crosstalk on a quantum computing device by performing crosstalk measurements (e.g., SRB experiments) on all quantum gate pairs of a quantum device.

Bar 608 depicts the amount of time it takes to characterize crosstalk on a quantum computing device using the 1 hop method (denoted as Opt 1: One hop in FIG. 6) described above (e.g., by performing crosstalk measurements (e.g., SRB experiments) on quantum gate pairs that are separated by 1 hop).

Bar 610 depicts the amount of time it takes to characterize crosstalk on a quantum computing device using the 1 hop method and bin packing method (denoted as Opt 2: One hop+Bin packing in FIG. 6) described above (e.g., by performing crosstalk measurements (e.g., SRB experiments) on quantum gate pairs that are separated by 1 hop and have been packed into a minimum number of bins by package component 108).

Bar 612 depicts the amount of time it takes to characterize crosstalk on a quantum computing device using only high crosstalk quantum gate pairs (denoted as Opt:3 Only high crosstalk pairs in FIG. 6) as described above (e.g., by performing crosstalk measurements (e.g., SRB experiments) on quantum gate pairs that have been identified as generating a high level of crosstalk).

As illustrated by bars 606, 608, 610, 612 in bar chart 602, crosstalk characterization system 102 (e.g., via package component 108, assessment component 110, and/or identification component 202) can thereby facilitate reduced crosstalk characterization time and/or computational costs of one or more computing resources (e.g., a processor) associated with crosstalk characterization system 102 that execute such crosstalk characterization.

Crosstalk characterization system 102 can be associated with various technologies. For example, crosstalk characterization system 102 can be associated with crosstalk characterization technologies, quantum crosstalk characterization technologies, bin packaging heuristic technologies, distributed quantum computation technologies, quantum computer technologies, quantum hardware and/or software technologies, machine learning technologies, artificial intelligence technologies, cloud computing technologies, and/or other technologies.

Crosstalk characterization system 102 can provide technical improvements to systems, devices, components, operational steps, and/or processing steps associated with the various technologies identified above. For example, crosstalk characterization system 102 can reduce crosstalk characterization time of a quantum device by reducing the number of experiments (e.g., crosstalk measurements) executed to measure conditional gate error rates.

Crosstalk characterization system 102 can provide technical improvements to a processing unit (e.g., processor 106) associated with a classical computing device and/or a quantum computing device (e.g., a quantum processor, quantum hardware, superconducting circuit, etc.) associated with crosstalk characterization system 102. For example, by facilitating such reduced crosstalk characterization time of a quantum device as described above (e.g., by reducing the number of experiments (e.g., crosstalk measurements) executed to measure conditional gate error rates), crosstalk characterization system 102 can thereby reduce computational costs of a processor (e.g., processor 106) that executes such crosstalk characterization (e.g., that executes crosstalk measurements for gate pairs of the quantum device).

Based on such reduced crosstalk characterization time and/or reduced computation costs described above, a practical application of crosstalk characterization system 102 is that it can be implemented by a quantum computing system and/or administrator (e.g., vendor) operating such a system to regularly (e.g., daily) characterize crosstalk of the system and/or provide such crosstalk data to an entity associated with and/or utilizing the system (e.g., an entity such as, for instance, a compiler that schedules quantum computing jobs to be executed by the system). Such a practical application of crosstalk characterization system 102 can improve the output (e.g., computation and/or processing results) of one or more compilation jobs (e.g., quantum computing jobs) that are executed on the quantum computing system.

It should be appreciated that crosstalk characterization system 102 provides a new approach driven by relatively new quantum computing technologies. For example, crosstalk characterization system 102 provides a new approach to characterizing crosstalk of a quantum computing device that is driven by currently long and computationally expensive methods used to characterize crosstalk of a quantum computing device.

Crosstalk characterization system 102 can employ hardware or software to solve problems that are highly technical in nature, that are not abstract and that cannot be performed as a set of mental acts by a human. In some embodiments, one or more of the processes described herein can be performed by one or more specialized computers (e.g., a specialized processing unit, a specialized classical computer, a specialized quantum computer, etc.) to execute defined tasks related to the various technologies identified above. Crosstalk characterization system 102 and/or components thereof, can be employed to solve new problems that arise through advancements in technologies mentioned above, employment of quantum computing systems, cloud computing systems, computer architecture, and/or another technology.

It is to be appreciated that crosstalk characterization system 102 can utilize various combinations of electrical components, mechanical components, and circuitry that cannot be replicated in the mind of a human or performed by a human, as the various operations that can be executed by crosstalk characterization system 102 and/or components thereof as described herein are operations that are greater than the capability of a human mind. For instance, the amount of data processed, the speed of processing such data, or the types of data processed by crosstalk characterization system 102 over a certain period of time can be greater, faster, or different than the amount, speed, or data type that can be processed by a human mind over the same period of time.

According to several embodiments, crosstalk characterization system 102 can also be fully operational towards performing one or more other functions (e.g., fully powered on, fully executed, etc.) while also performing the various operations described herein. It should be appreciated that such simultaneous multi-operational execution is beyond the capability of a human mind. It should also be appreciated that crosstalk characterization system 102 can include information that is impossible to obtain manually by an entity, such as a human user. For example, the type, amount, and/or variety of information included in crosstalk characterization system 102, package component 108, assessment component 110, and/or identification component 202 can be more complex than information obtained manually by a human user.

Figure 7A:
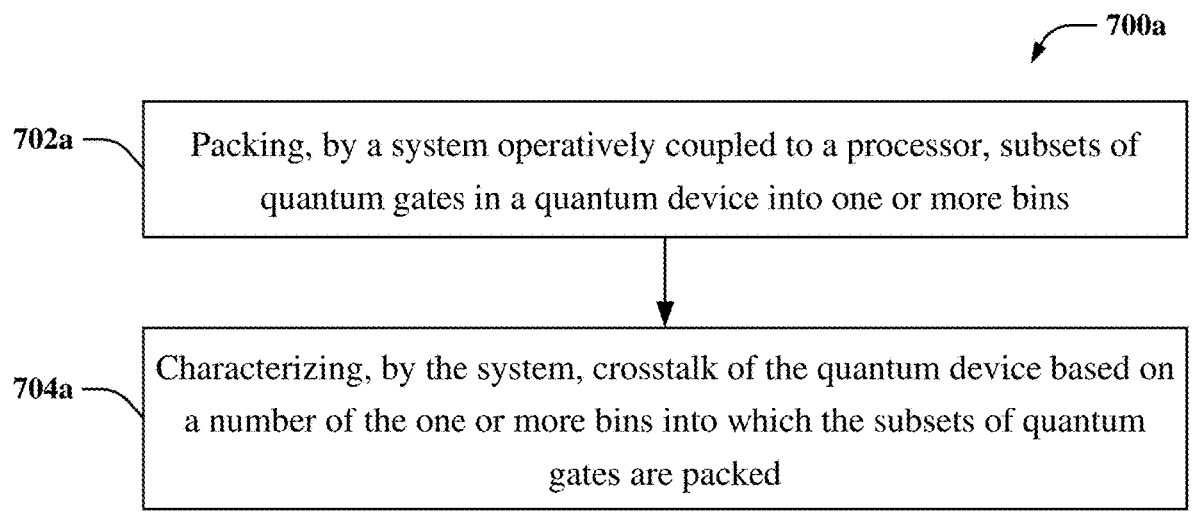
FIGS. 7A, 7B, and 7C illustrate flow diagrams of example, non-limiting computer-implemented methods that can facilitate characterizing crosstalk of a quantum computing system based on sparse data collection in accordance with one or more embodiments described herein.

FIG. 7A illustrates a flow diagram of an example, non-limiting computer-implemented method 700a that can facilitate characterizing crosstalk of a quantum computing system based on sparse data collection in accordance with one or more embodiments described herein. Repetitive description of like elements and/or processes employed in respective embodiments is omitted for sake of brevity.

At 702a, computer-implemented method 700a can comprise packing, by a system (e.g., via crosstalk characterization system 102 and/or package component 108) operatively coupled to a processor (e.g., processor 106, a quantum processor, etc.), subsets of quantum gates (e.g., gate pairs 404, 406, 408 and/or gate pairs 410, 412, 414) in a quantum device (e.g., quantum computer, quantum processor, quantum circuit, quantum hardware, etc.) into one or more bins.

At 704a, computer-implemented method 700a can comprise characterizing, by the system (e.g., via crosstalk characterization system 102 and/or assessment component 110) crosstalk of the quantum device based on a number (e.g., a minimum number) of the one or more bins into which the subsets of quantum gates are packed.

Figure 7B:
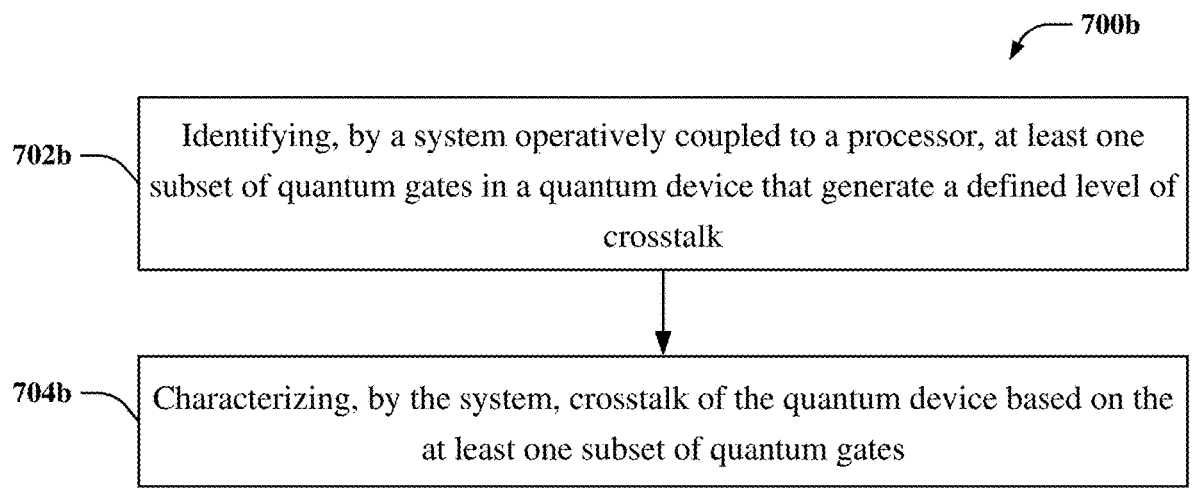

FIG. 7B illustrates a flow diagram of an example, non-limiting computer-implemented method 700b that can facilitate characterizing crosstalk of a quantum computing system based on sparse data collection in accordance with one or more embodiments described herein. Repetitive description of like elements and/or processes employed in respective embodiments is omitted for sake of brevity.

At 702b, computer-implemented method 700b can comprise identifying, by a system (e.g., via crosstalk characterization system 102 and/or identification component 202) operatively coupled to a processor (e.g., processor 106, a quantum processor, etc.), at least one subset of quantum gates (e.g., gate pair 506c and/or gate pair 506d) in a quantum device that generate a defined level of crosstalk (e.g., a high level of crosstalk relative to other subsets of quantum gates in the quantum device).

At 704b, computer-implemented method 700b can comprise characterizing, by the system (e.g., via crosstalk characterization system 102 and/or assessment component 110) crosstalk of the quantum device based on the at least one subset of quantum gates.

Figure 7C:
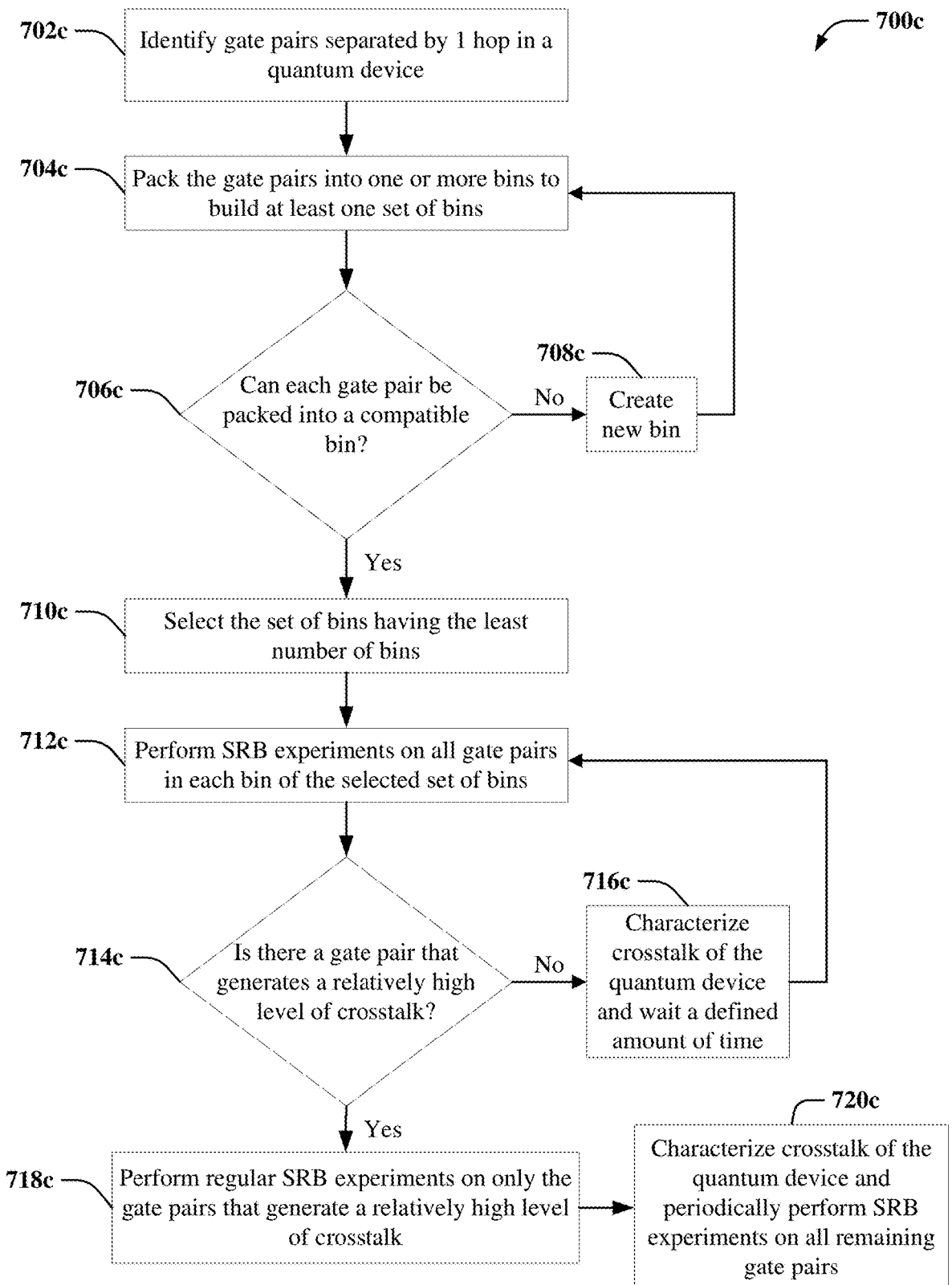

FIG. 7C illustrates a flow diagram of an example, non-limiting computer-implemented method 700c that can facilitate characterizing crosstalk of a quantum computing system based on sparse data collection in accordance with one or more embodiments described herein. Repetitive description of like elements and/or processes employed in respective embodiments is omitted for sake of brevity.

At 702c, computer-implemented method 700c can comprise identifying (e.g., via package component 108 and/or a heuristic bin packing algorithm employed by package component 108) gate pairs separated by 1 hop (e.g., gate pairs 404, 406, 408 of qubit coupling map 402a and/or gate pairs 410, 412, 414 of qubit coupling map 402b) in a quantum device (e.g., quantum computer, quantum processor, quantum hardware, etc.).

At 704c, computer-implemented method 700c can comprise packing (e.g., via package component 108) the gate pairs into one or more bins to build at least one set of bins. For example, as described above, given a set of n gate pairs on which SRB measurements are to be performed, package component 108 can use a heuristic technique (e.g., a heuristic algorithm), for instance, a randomized first fit heuristic (e.g., a bin packing algorithm) to pack the gate pairs into a small number of experiments. For instance, package component 108 can employ such a heuristic to iteratively build a set of bins, where each bin corresponds to an experiment and initially, there is only one empty bin.

At 706c, computer-implemented method 700c can comprise determining (e.g., via package component 108) whether each gate pair can be packed into a compatible bin. For example, as described above, package component 108 can employ the heuristic to iterate through the gate pairs of a quantum computing device (e.g., gate pairs 404, 406, 408 and/or gate pairs 410, 412, 414) and place each gate pair in the first compatible bin, where a gate pair ($g_i$, $g_j$) is compatible with a bin if all gate pairs ($g_k$, $g_l$) in the bin are at least k hops away. For instance, with reference to FIG. 4, in a certain quantum computing device, with k=2, gate pair 408 (CNOT 15,16|CNOT 17,18) is compatible with a bin which contains gate pair 406 (CNOT 6,7|CNOT 8,9); it is not compatible with a bin which contains a gate pair defined as CNOT 10,11|CNOT 12,13).

If it is determined at 706c that a certain gate pair cannot be packed into an existing compatible bin, at 708c, computer-implemented method 700c can comprise creating a new bin (e.g., via package component 108). For example, as described above, when no existing bin is compatible, package component 108 can employ the heuristic to create a new bin. Based on application of such a heuristic by package component 108, all gate pairs can be partitioned into one or more sets of bins in this manner Package component 108 can repeat steps 704c, 706c, 708c to execute the heuristic algorithm multiple times by shuffling the list of gate pairs randomly.

If it is determined at 706c that each gate pair can be packed into an existing compatible bin, at 710c, computer-implemented method 700c can comprise selecting (e.g., via package component 108) the set of bins having the least number of bins. For example, as described above, package component 108 can select the partitioning (e.g., the set of bins) with the minimum number of bins (e.g., the lowest number of bins).

At 712c, computer-implemented method 700c can comprise performing (e.g., via assessment component 110) SRB experiments on all gate pairs in each bin of the selected set of bins. For example, as described above, based on such partitioning of all gate pairs in a quantum device and selection of the partitioning with the minimum number of bins, assessment component 110 can perform SRB experiments in parallel for all gate pairs from a single bin.

At 714c, computer-implemented method 700c can comprise determining (e.g., via identification component 202) whether there is a gate pair that generates a relatively high level of crosstalk. For example, as described above with reference to FIG. 2, based on the results of the SRB experiments (e.g., based on the crosstalk measurements of each of the gate pairs), identification component 202 can identify one or more gate pairs that generate a high level of crosstalk relative to other gate pairs.

If it is determined at 714c that there are no gate pairs that generate a relatively high level of crosstalk, at 716c, computer-implemented method 700c can comprise characterizing (e.g., via assessment component 110) crosstalk of the quantum device based on the SRB experiments performed at 712c and waiting a defined amount of time (e.g., 3 to 5 days) before repeating the SRB experiments at 712c (e.g., via assessment component 110).

If it is determined at 714c that there is a gate pair that generates a relatively high level of crosstalk, at 718c, computer-implemented method 700c can comprise performing (e.g., via assessment component 110) regular (e.g., daily) SRB experiments on only the gate pairs that generate a relatively high level of crosstalk (e.g., gate pair 506c and/or gate pair 506d as illustrated in FIG. 5).

At 720c, computer-implemented method 700c can comprise characterizing (e.g., via assessment component 110) crosstalk of the quantum device and periodically perform SRB experiments on all remaining gate pairs (e.g., by performing SRB experiments on the gate pairs remaining in each bin of the selected set of bins that do not generate a high level of crosstalk). For example, as described above, assessment component 110 can perform regular (e.g., daily) crosstalk measurements on high-crosstalk pairs only, and periodically, for instance, once every 3 to 5 days, characterize the remaining 1 hop gate pairs (e.g., by performing SRB experiments on the gate pairs remaining in each bin of the selected set of bins that do not generate a high level of crosstalk).

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 8:
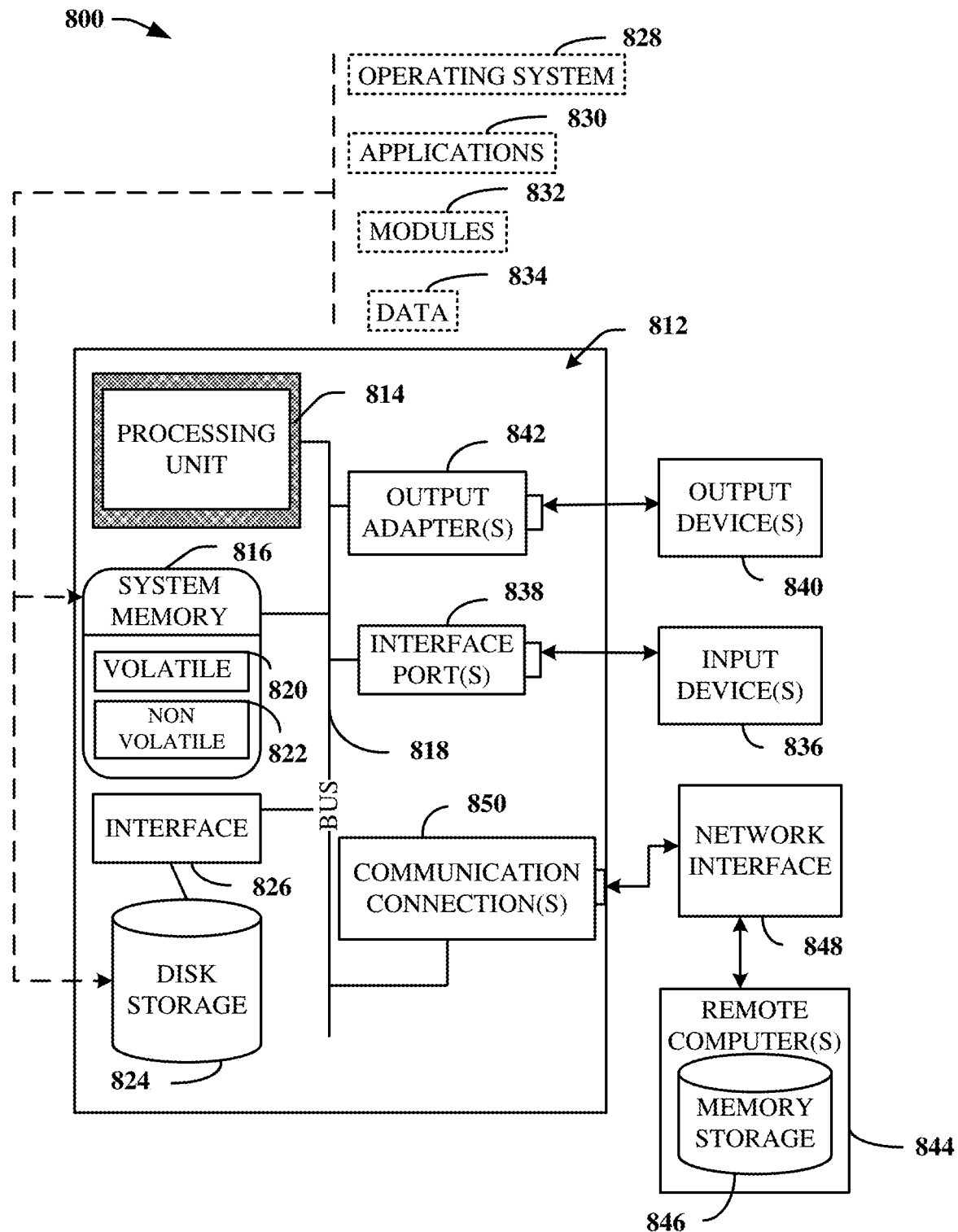
FIG. 8 illustrates a block diagram of an example, non-limiting operating environment in which one or more embodiments described herein can be facilitated.

In order to provide a context for the various aspects of the disclosed subject matter, FIG. 8 as well as the following discussion are intended to provide a general description of a suitable environment in which the various aspects of the disclosed subject matter can be implemented. FIG. 8 illustrates a block diagram of an example, non-limiting operating environment in which one or more embodiments described herein can be facilitated. Repetitive description of like elements employed in other embodiments described herein is omitted for sake of brevity.

With reference to FIG. 8, a suitable operating environment 800 for implementing various aspects of this disclosure can also include a computer 812. The computer 812 can also include a processing unit 814, a system memory 816, and a system bus 818. The system bus 818 couples system components including, but not limited to, the system memory 816 to the processing unit 814. The processing unit 814 can be any of various available processors. Dual microprocessors and other multiprocessor architectures also can be employed as the processing unit 814. The system bus 818 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 816 can also include volatile memory 820 and nonvolatile memory 822. The basic input/output system (BIOS), containing the basic routines to transfer information between elements within the computer 812, such as during start-up, is stored in nonvolatile memory 822. Computer 812 can also include removable/non-removable, volatile/non-volatile computer storage media. FIG. 8 illustrates, for example, a disk storage 824. Disk storage 824 can also include, but is not limited to, devices like a magnetic disk drive, floppy disk drive, tape drive, Jaz drive, Zip drive, LS-100 drive, flash memory card, or memory stick. The disk storage 824 also can include storage media separately or in combination with other storage media. To facilitate connection of the disk storage 824 to the system bus 818, a removable or non-removable interface is typically used, such as interface 826. FIG. 8 also depicts software that acts as an intermediary between users and the basic computer resources described in the suitable operating environment 800. Such software can also include, for example, an operating system 828. Operating system 828, which can be stored on disk storage 824, acts to control and allocate resources of the computer 812.

System applications 830 take advantage of the management of resources by operating system 828 through program modules 832 and program data 834, e.g., stored either in system memory 816 or on disk storage 824. It is to be appreciated that this disclosure can be implemented with various operating systems or combinations of operating systems. A user enters commands or information into the computer 812 through input device(s) 836. Input devices 836 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 814 through the system bus 818 via interface port(s) 838. Interface port(s) 838 include, for example, a serial port, a parallel port, a game port, and a universal serial bus (USB). Output device(s) 840 use some of the same type of ports as input device(s) 836. Thus, for example, a USB port can be used to provide input to computer 812, and to output information from computer 812 to an output device 840. Output adapter 842 is provided to illustrate that there are some output devices 840 like monitors, speakers, and printers, among other output devices 840, which require special adapters. The output adapters 842 include, by way of illustration and not limitation, video and sound cards that provide a means of connection between the output device 840 and the system bus 818. It should be noted that other devices and/or systems of devices provide both input and output capabilities such as remote computer(s) 844.

Computer 812 can operate in a networked environment using logical connections to one or more remote computers, such as remote computer(s) 844. The remote computer(s) 844 can be a computer, a server, a router, a network PC, a workstation, a microprocessor based appliance, a peer device or other common network node and the like, and typically can also include many or all of the elements described relative to computer 812. For purposes of brevity, only a memory storage device 846 is illustrated with remote computer(s) 844. Remote computer(s) 844 is logically connected to computer 812 through a network interface 848 and then physically connected via communication connection 850. Network interface 848 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 850 refers to the hardware/software employed to connect the network interface 848 to the system bus 818. While communication connection 850 is shown for illustrative clarity inside computer 812, it can also be external to computer 812. The hardware/software for connection to the network interface 848 can also include, for exemplary purposes only, internal and external technologies such as, modems including regular telephone grade modems, cable modems and DSL modems, ISDN adapters, and Ethernet cards.

Figure 9:
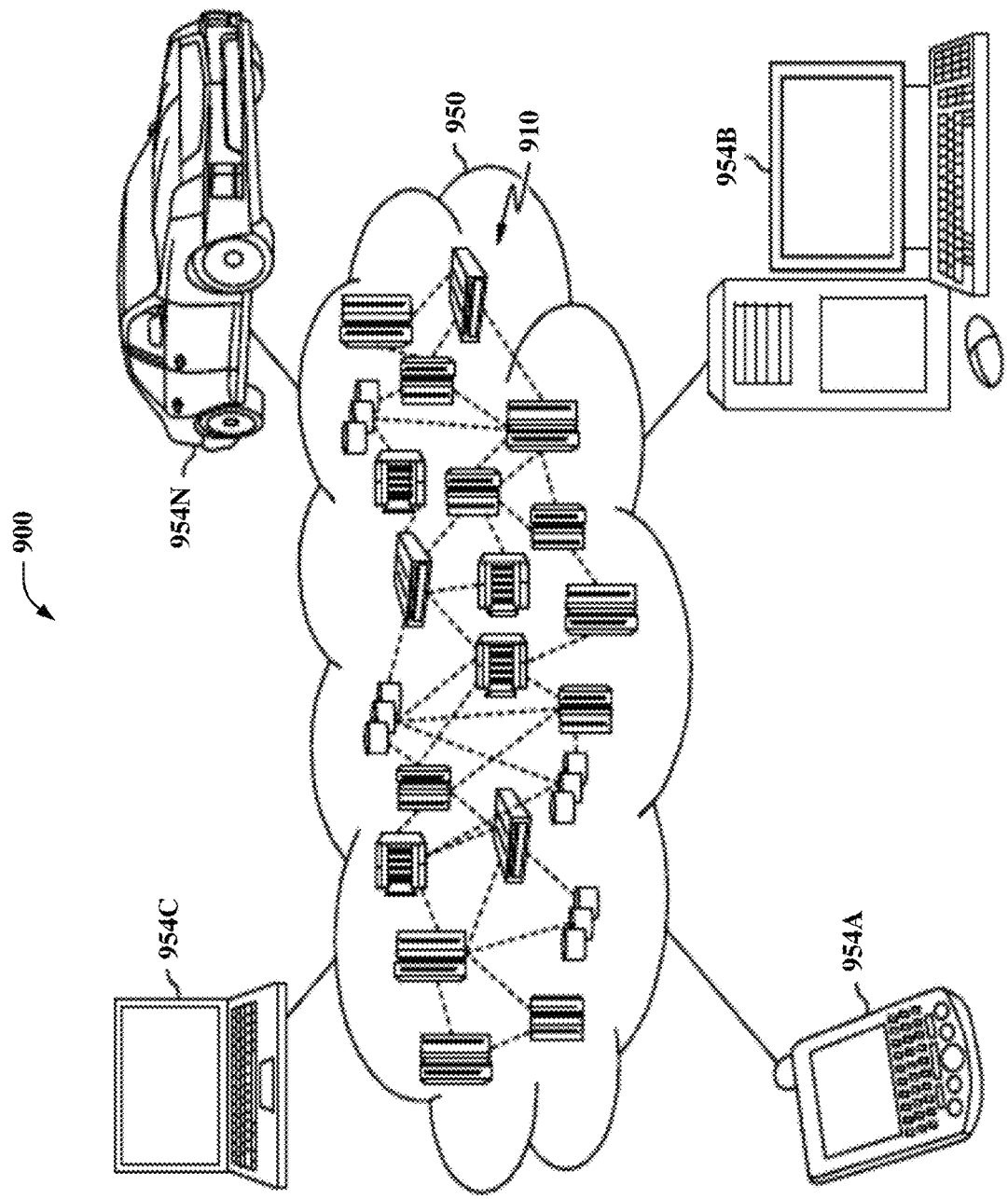
FIG. 9 illustrates a block diagram of an example, non-limiting cloud computing environment in accordance with one or more embodiments of the subject disclosure.

Referring now to FIG. 9, an illustrative cloud computing environment 950 is depicted. As shown, cloud computing environment 950 includes one or more cloud computing nodes 910 with which local computing devices used by cloud consumers, such as, for example, personal digital assistant (PDA) or cellular telephone 954A, desktop computer 954B, laptop computer 954C, and/or automobile computer system 954N may communicate. Although not illustrated in FIG. 9, cloud computing nodes 910 can further comprise a quantum platform (e.g., quantum computer, quantum hardware, quantum software, etc.) with which local computing devices used by cloud consumers can communicate. Nodes 910 may communicate with one another. They may be grouped (not shown) physically or virtually, in one or more networks, such as Private, Community, Public, or Hybrid clouds as described hereinabove, or a combination thereof. This allows cloud computing environment 950 to offer infrastructure, platforms and/or software as services for which a cloud consumer does not need to maintain resources on a local computing device. It is understood that the types of computing devices 954A-N shown in FIG. 9 are intended to be illustrative only and that computing nodes 910 and cloud computing environment 950 can communicate with any type of computerized device over any type of network and/or network addressable connection (e.g., using a web browser).

Figure 10:
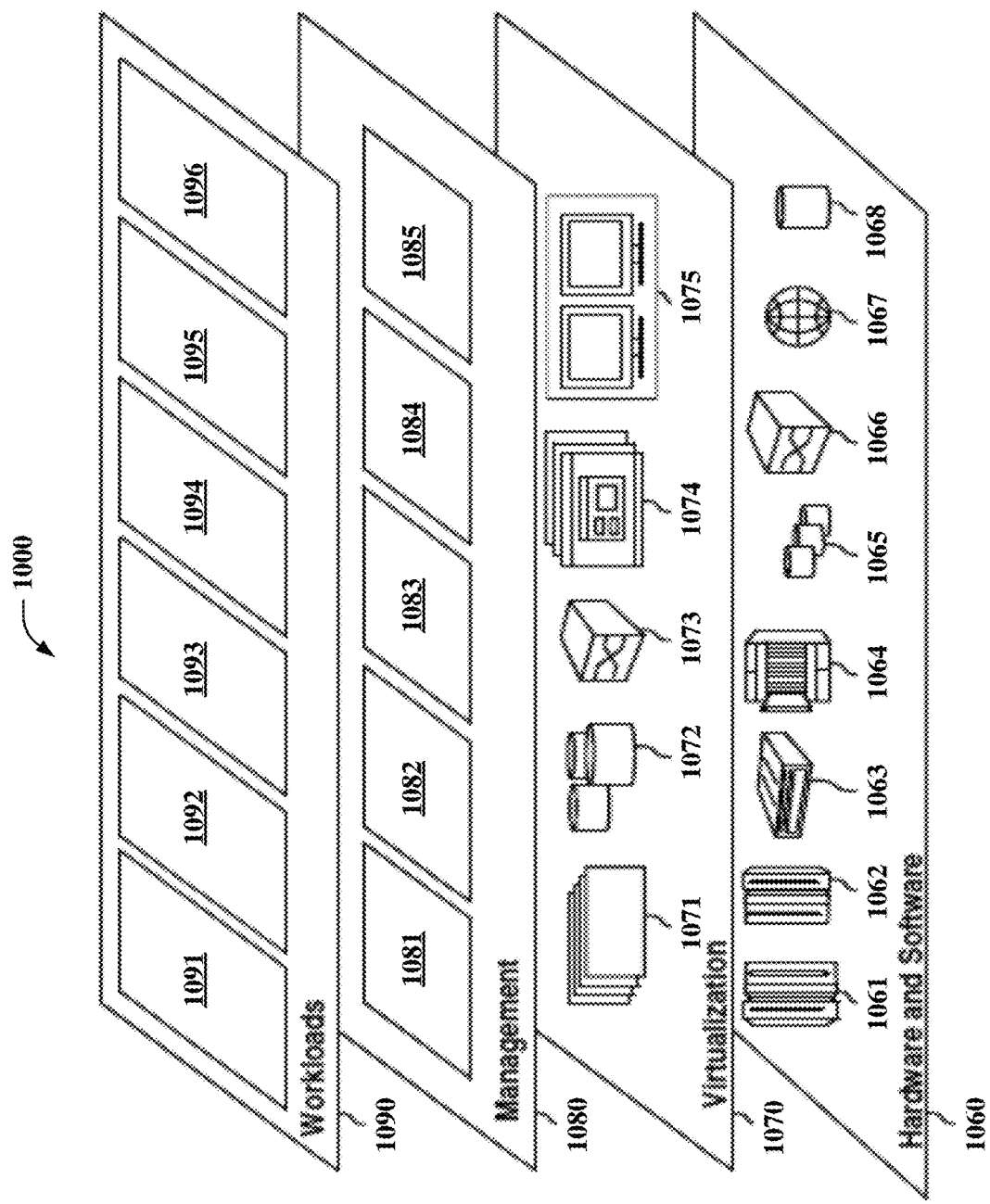
FIG. 10 illustrates a block diagram of example, non-limiting abstraction model layers in accordance with one or more embodiments of the subject disclosure.

Referring now to FIG. 10, a set of functional abstraction layers provided by cloud computing environment 950 (FIG. 9) is shown. It should be understood in advance that the components, layers, and functions shown in FIG. 10 are intended to be illustrative only and embodiments of the invention are not limited thereto. As depicted, the following layers and corresponding functions are provided:

Hardware and software layer 1060 includes hardware and software components. Examples of hardware components include: mainframes 1061; RISC (Reduced Instruction Set Computer) architecture based servers 1062; servers 1063; blade servers 1064; storage devices 1065; and networks and networking components 1066. In some embodiments, software components include network application server software 1067, quantum platform routing software 1068, and/or quantum software (not illustrated in FIG. 10).

Virtualization layer 1070 provides an abstraction layer from which the following examples of virtual entities may be provided: virtual servers 1071; virtual storage 1072; virtual networks 1073, including virtual private networks; virtual applications and operating systems 1074; and virtual clients 1075.

In one example, management layer 1080 may provide the functions described below. Resource provisioning 1081 provides dynamic procurement of computing resources and other resources that are utilized to perform tasks within the cloud computing environment. Metering and Pricing 1082 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1083 provides access to the cloud computing environment for consumers and system administrators. Service level management 1084 provides cloud computing resource allocation and management such that required service levels are met. Service Level Agreement (SLA) planning and fulfillment 1085 provide pre-arrangement for, and procurement of, cloud computing resources for which a future requirement is anticipated in accordance with an SLA.

Workloads layer 1090 provides examples of functionality for which the cloud computing environment may be utilized. Non-limiting examples of workloads and functions which may be provided from this layer include: mapping and navigation 1091; software development and lifecycle management 1092; virtual classroom education delivery 1093; data analytics processing 1094; transaction processing 1095; and crosstalk characterization software 1096.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
a memory that stores computer executable components; and
a processor that executes the computer executable components stored in the memory, wherein the computer executable components comprise:
a package component that:
selects a set of pairs of quantum gates from all pairs of quantum gates of a quantum device, wherein each pair of quantum gates in the set has exactly one other quantum gate intervening between the quantum gates of the pair, and
packs the pairs of quantum gates of the set into bins; and
an assessment component that characterizes crosstalk of the quantum device based on the bins into which the pairs of quantum gates are packed.

2. The system of claim 1, wherein each bin of the bins comprises a different subset of the pairs of quantum gates of the set, and wherein for each subset of the pairs of the quantum gates:
each pair of quantum gates in the subset have two or more other quantum gates consecutively intervening between the pair of quantum gates and every other pair of the quantum gates in the subset.

3. The system of claim 1, wherein the assessment component performs crosstalk measurements of respective pairs of quantum gates in one or more of the bins of quantum gates to characterize the crosstalk of the quantum device.

4. The system of claim 3, wherein the assessment component performs the crosstalk measurements at a defined interval of time to capture crosstalk variations of respective pairs of quantum gates of at least one of the bins of quantum gates.

5. The system of claim 1, wherein the assessment component simultaneously performs parallelized crosstalk measurements of at least two of the bins of quantum gates to characterize the crosstalk of the quantum device, thereby facilitating at least one of reduced computational costs of the processor or reduced time to characterize the crosstalk of the quantum device.

6. A computer-implemented method, comprising:
selecting, by a system operatively coupled to a processor, a set of pairs of quantum gates from all pairs of quantum gates of a quantum device, wherein each pair of quantum gates in the set has exactly one other quantum gate intervening between the quantum gates of the pair; and
packing, by the system, the pairs of quantum gates of the set into bins; and
characterizing, by the system, crosstalk of the quantum device based on the bins into which the pairs of quantum gates are packed.

7. The computer-implemented method of claim 6, wherein each bin of the bins comprises a different subset of the pairs of quantum gates of the set, and wherein for each subset of the pairs of the quantum gates:
each pair of quantum gates in the subset have two or more other quantum gates consecutively intervening between the pair of quantum gates and every other pair of the quantum gates in the subset.

8. The computer-implemented method of claim 6, further comprising:
performing, by the system, crosstalk measurements of respective pairs of quantum gates in one or more of the bins of quantum gates to characterize the crosstalk of the quantum device.

9. The computer-implemented method of claim 8, further comprising:
performing, by the system, the crosstalk measurements at a defined interval of time to capture crosstalk variations of respective pairs of quantum gates of at least one of the bins of quantum gates.

10. The computer-implemented method of claim 6, further comprising:
performing, by the system, simultaneous parallelized crosstalk measurements of at least two of the bins of quantum gates to characterize the crosstalk of the quantum device, thereby facilitating at least one of reduced computational costs of the processor or reduced time to characterize the crosstalk of the quantum device.

11. A computer program product facilitating a process to characterize crosstalk of a quantum computing system based on sparse data collection, the computer program product comprising a computer readable storage medium having program instructions embodied therewith, the program instructions executable by a processor to cause the processor to:
select, by the processor, a set of pairs of quantum gates from all pairs of quantum gates of a quantum device, wherein each pair of quantum gates in the set has exactly one other quantum gate intervening between the quantum gates of the pair; and
pack, by the processor, the pairs of quantum gates of the set into bins; and
characterize, by the processor, the crosstalk of the quantum device based on the bins into which the pairs of quantum gates are packed.

12. The computer program product of claim 11, wherein each bin of the bins comprises a different subset of the pairs of quantum gates of the set, and wherein for each subset of the pairs of the quantum gates:
each pair of quantum gates in the subset have two or more other quantum gates consecutively intervening between the pair of quantum gates and every other pair of the quantum gates in the subset.

13. The computer program product of claim 11, wherein the program instructions are further executable by the processor to cause the processor to:
perform, by the processor, crosstalk measurements of respective pairs of quantum gates in one or more of the bins of quantum gates to characterize the crosstalk of the quantum device.

14. The computer program product of claim 13, wherein the program instructions are further executable by the processor to cause the processor to:
perform, by the processor, the crosstalk measurements at a defined interval of time to capture crosstalk variations of respective pairs of quantum gates of at least one of the bins of quantum gates.

15. The computer program product of claim 11, wherein the program instructions are further executable by the processor to cause the processor to:

perform, by the processor, simultaneous parallelized crosstalk measurements of at least two of the bins of quantum gates to characterize the crosstalk of the quantum device.

16. A system, comprising:
a memory that stores computer executable components; and
a processor that executes the computer executable components stored in the memory, wherein the computer executable components comprise:
an identification component that identifies at least one bin of quantum gates, from a group of bins of quantum gates of a quantum device, that generates a defined level of crosstalk, wherein respective bins of the group of bins comprise different subsets of pairs of quantum gates of a set of pairs of quantum gates selected from all pairs of quantum gates of the quantum device, and wherein each pair of quantum gates in the set has exactly one other quantum gate intervening between the quantum gates of the pair; and
an assessment component that characterizes crosstalk of the quantum device based on the at least one bin of quantum gates.

17. The system of claim 16, wherein for each bin of quantum gates:
each pair of quantum gates in the bin have at least two other quantum gates consecutively intervening between the pair of quantum gates and every other pair of quantum gates in the bin.

18. The system of claim 16, wherein the computer executable components further comprise:
a package component that packs different subsets of the pairs of quantum gates of the set into the respective bins, and wherein the assessment component characterizes the crosstalk of the quantum device based on the respective bins.

19. The system of claim 16, wherein the assessment component:
simultaneously performs parallelized crosstalk measurements of the bins of quantum gates at a first defined time to identify the at least one bin of quantum gates of the quantum device that generates the defined level of crosstalk; and
characterizes the crosstalk of the quantum device at a second defined time based on the at least one bin of quantum gates that generates the defined level of crosstalk.

20. The system of claim 16, wherein the identification component identifies the at least one bin of quantum gates based on crosstalk measurements of the respective bins of quantum gates performed at a defined interval of time, thereby facilitating at least one of reduced computational costs of the processor or reduced time to characterize the crosstalk of the quantum device.

21. A computer-implemented method, comprising:
identifying, by a system operatively coupled to a processor, at least one bin of quantum gates, from a group of bins of quantum gates of a quantum device, that generates a defined level of crosstalk, wherein respective bins of the group of bins comprise different subsets of pairs of quantum gates of a set of pairs of quantum gates selected from all pairs of quantum gates of the quantum device, and wherein each pair of quantum gates in the set has exactly one other quantum gate intervening between the quantum gates of the pair; and
characterizing, by the system, crosstalk of the quantum device based on the at least one bin of quantum gates.

22. The computer-implemented method of claim 21, wherein for each bin of quantum gates:
each pair of quantum gates in the bin have at least two other quantum gates consecutively intervening between the pair of quantum gates and every other pair of quantum gates in the bin.

23. The computer-implemented method of claim 21, further comprising:
packing, by the system, the different subsets of the pairs of quantum gates of the set into the respective bins; and
characterizing, by the system, the crosstalk of the quantum device based on the respective bins.

24. The computer-implemented method of claim 21, further comprising:
performing, by the system, simultaneous parallelized crosstalk measurements of the bins of quantum gates at a first defined time to identify the at least one bin of quantum gates of the quantum device that generates the defined level of crosstalk; and
characterizing, by the system, the crosstalk of the quantum device at a second defined time based on the at least one bin of quantum gates that generates the defined level of crosstalk.

25. The computer-implemented method of claim 21, further comprising:
identifying, by the system, the at least one bin of quantum gates based on crosstalk measurements of the respective bins of quantum gates performed at a defined interval of time.

* * * * *